(12) United States Patent
Suzuki

(10) Patent No.: US 6,881,532 B2
(45) Date of Patent: Apr. 19, 2005

(54) METHOD OF PROCESSING LIGHT SENSITIVE PLANOGRAPHIC PRINTING PLATE PRECURSOR AND PRE-WASHING SOLUTION USED IN THE METHOD

(75) Inventor: Toshitsugu Suzuki, Hachioji (JP)

(73) Assignee: Konica Corporation, Tokyo (JP)

( * ) Notice: Subject to any disclaimer, the term of this patent is extended or adjusted under 35 U.S.C. 154(b) by 0 days.

(21) Appl. No.: 10/628,928

(22) Filed: Jul. 28, 2003

(65) Prior Publication Data

US 2004/0072102 A1 Apr. 15, 2004

(30) Foreign Application Priority Data

Aug. 9, 2002 (JP) ........................................ 2002-232777

(51) Int. Cl.$^7$ ............................. G03F 7/00; G03F 7/38; C11D 3/16; C11D 3/26
(52) U.S. Cl. ..................................... 430/302; 430/309
(58) Field of Search .................................. 430/302, 309

(56) References Cited

U.S. PATENT DOCUMENTS 6,162,575 A 12/2000 Fujioka et al.

FOREIGN PATENT DOCUMENTS

JP 10-10754 A * 1/1998 .............. G03F/7/38

OTHER PUBLICATIONS

English Machine Translation of JP 10–010754 from Patent Abstracts of Japan, 16 pages, publication date of application Jan. 16, 1998.*
RN 64–02–8, Registry, Copyright 2004, ACS on STN, one page.*

DATABASE WPI, Section Ch, Week 199813, Derwent Publications Ltd., London, GB; An 1998–134769 XP002261859 of JP 10 010754 A (Konica Corp), Jan. 16, 1998.

DATABASE WPI, Section Ch, Week 199803, Derwent Publications Ltd., London, GB; AN 1998–029443 XP002261860 of JP 09 288357 A (Konica Corp.), Nov. 4, 1997.

* cited by examiner

*Primary Examiner*—Cynthia Hamilton
(74) *Attorney, Agent, or Firm*—Frishauf, Holtz, Goodman & Chick, P.C.

(57) ABSTRACT

Disclosed is a method of processing a light sensitive planographic printing plate precursor comprising a support, and provided thereon, a light sensitive layer and an overcoat layer in that order, the method comprising the steps of imagewise exposing the light sensitive planographic printing plate precursor, pre-washing the exposed light sensitive planographic printing plate precursor with a pre-washing solution in the presence of a compound represented by the following formula (1) or (2), or an N-alkyliminodiacetic acid or its salt, the alkyl having a carbon atom number of 1 to 3, and developing the pre-washed light sensitive planographic printing plate precursor with a developer,

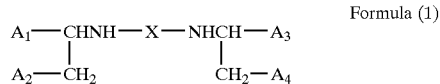

Formula (1)

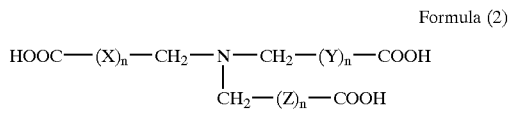

Formula (2)

16 Claims, 1 Drawing Sheet

US 6,881,532 B2

METHOD OF PROCESSING LIGHT SENSITIVE PLANOGRAPHIC PRINTING PLATE PRECURSOR AND PRE-WASHING SOLUTION USED IN THE METHOD

FIELD OF THE INVENTION

The present invention relates to a method of processing a light sensitive printing plate precursor, and a washing liquid used in the method, which can minimize stain spots (hereinafter referred to as peppering) and reduce sludge produced during processing.

BACKGROUND OF THE INVENTION

Lithography is a printing method employing the characteristics in which oil is immiscible with water. On a planographic printing plate are formed image portions, which repel water and receive oleophilic ink, and non-image portions, which repel oleophilic ink and receive water. Then, lithographic printing is carried out in which only oleophilic ink received on the image portions of such a planographic printing plate is transferred to a paper sheet. As a printing press for lithographic printing is generally used an off-set printing press in which the oleophilic ink received on the image portions is once transferred onto a blanket, and then the ink on the blanket is further transferred onto a paper sheet.

A light sensitive planographic printing plate precursor comprises a support and provided thereon, a light sensitive layer. As the support of the light sensitive planographic printing plate precursor, one having high hydrophilicity, high water retention property, and excellent adhesion to the light sensitive layer is desired, and an aluminum plate whose surface is subjected to roughening treatment is generally used.

As a method for surface roughening a support is known a mechanical surface-roughening method such as a ball graining method, a brush graining method, a blast graining method, a buffing method or a horning method, or a electrochemical method in which the support surface is electrically roughened in an electrolyte solution of an acid such as hydrochloric acid or nitric acid through a direct current or an alternating current. The surface of an aluminum plate treated according to the method described above is relatively soft and is likely to be abraded, the surface-roughened aluminum plate is subjected to anodization treatment to form an anodization film on the surface. The resulting aluminum plate surface is hard and excellent in abrasion resistance.

An exposed planographic printing plate precursor is developed with an alkaline aqueous solution to remove a light sensitive layer at exposed or unexposed portions and unveil the support surface. The support surface is generally hydrophilic, and the support surface unveiled by development (corresponding to non-image portions) receives water and repels oil-based ink. In contrast, portions (corresponding to image portions), in which the light sensitive layer has not been removed by development, are generally oleophilic, and receive oil-based ink and repel water.

A light sensitive planographic printing plate precursor with high sensitivity reduces the time required for exposure, and can shorten the time necessary to prepare a printing plate. When printing is carried out employing a printing plate obtained from such a planographic printing plate precursor, printing is often suspended on account of registering or a break. When printing, after suspended, is resumed, minute stain spots (hereinafter referred to as peppering) may occur at the non-image portions of the printing plate. In order to prevent occurrence of the peppering, a method has been desired which maintains hydrophilicity of the non-image portions of the printing plate.

An aqueous alkali metal silicate solution has been widely used as a developer of the light sensitive planographic printing plate precursor. The alkali metal silicate of the aqueous alkali metal silicate solution reacts with the aluminum plate support, whereby hydrophilicity of the aluminum support surface is increased. However, this method alone cannot provide sufficient hydrophilicity of the support surface and cannot completely prevent occurrence of the peppering.

A photopolymerization type light sensitive planographic printing plate precursor comprising a photoinitiator and an ethylenically unsaturated monomer, which is capable of forming a latent image due to free radical reaction and developed with an aqueous alkali solution to form an image, has high sensitivity. The photopolymerization type light sensitive planographic printing plate precursor generally has high sensitivity, but has problem in that free radical reaction is inhibited by oxygen. In order to overcome the problem, an oxygen-shielding layer is provided on the light sensitive layer. It is well known that a layer containing polyvinyl alcohol as a main component is effective as the oxygen-shielding layer. However, the polyvinyl alcohol-containing layer, when incorporated in a developer during development, produces sludge in the developer. In order to overcome this problem, it is effective that washing (prewashing or washing before development) for removing the oxygen-shielding layer is carried out employing a prewashing solution prior to development. However, it has been found that when a light sensitive planographic printing plate precursor comprising the polyvinyl alcohol-containing layer, is repeatedly subjected to processing as described above, employing an automatic developing machine, sludge occurs in a pre-washing solution, resulting in problem requiring an additional work such as cleaning or unclogging of a pump. As the countermeasure, a method is disclosed in Japanese Patent O.P.I. Publication No. 10-10754 in which various additives are added to a pre-washing solution for pre-washing prior to development. However, this method cannot solve the problems including occurrence of the peppering.

SUMMARY OF THE INVENTION

The present invention has been made in view of the above. An object of the invention is to provide a light sensitive planographic printing plate precursor processing method of providing a planographic printing plate which prevents peppering from occurring at non-image portions of the printing plate, when printing is started employing the printing plate, suspended, and then resumed, and to provide a pre-washing solution used in the method. Another object of the invention is to provide a light sensitive planographic printing plate precursor processing method of minimizing sludge produced in a developing tank during and after continuous long-term processing, and to provide a pre-washing solution used in the method.

DETAILED DESCRIPTION OF THE INVENTION

Figure 1:
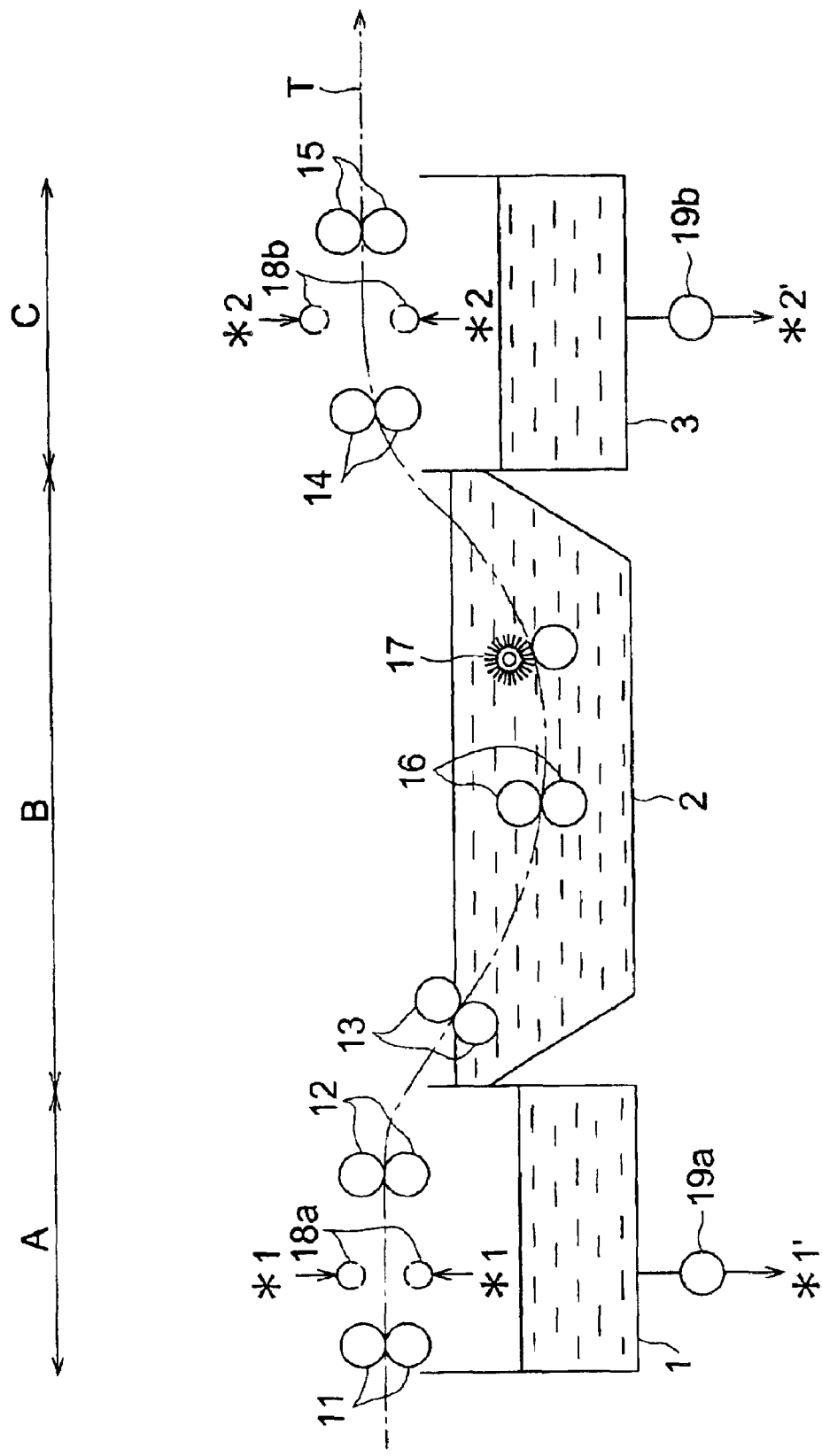
FIG. 1 shows a schematic view of an automatic developing machine for processing a light sensitive planographic printing plate precursor.

The above objects of the invention can be attained by the followings:

1—1. A method of processing a light sensitive planographic printing plate precursor comprising a support, and provided thereon, a light sensitive layer and an overcoat layer in that order, the method comprising the steps of, imagewise exposing the light sensitive planographic printing plate precursor, pre-washing the exposed light sensitive planographic printing plate precursor with a pre-washing solution in the presence of a compound represented by the following formula (1) or (2), or an N-alkyliminodiacetic acid or its salt, the alkyl having a carbon atom number of 1 to 3, an developing the pre-washed light sensitive planographic printing plate precursor with a developer,

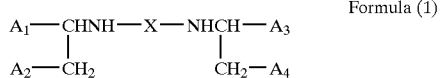

Formula (1)

wherein $A_1$, $A_2$, $A_3$, and $A_4$ independently represents —$CH_2OH$, —$PO_3(M_1)_2$, or —COOM, in which M and $M_1$ independently represent a hydrogen atom, an ammonium group, an alkali metal atom or an organic ammonium group, and may be the same or different; and X represents an alkylene group having a carbon atom number of 2 to 4 or —$(B_1O)_n$—$(B_2)$—, in which $B_1$ and $B_2$ independently represent an alkylene group having a carbon atom number of 1 to 5, and may be the same or different, and n is an integer of 1 to 8,

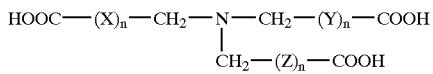

Formula (2)

wherein X, Y and Z independently represents —$CH_2$—, —$(CH_2)_2$—, or —CHOH—, and n is 0 or 1.

1-2. The method of item 1—1 above, wherein the pre-washing is carried out employing a pre-washing solution which is an aqueous solution containing the compound represented by formula (1) or (2), or the N-alkyliminodiacetic acid or its salt.

1-3. The method of item 1-2 above, wherein the pre-washing solution is an aqueous solution containing a compound represented by formula (1).

1-4. The method of item 1-2 above, wherein the pre-washing solution is an aqueous solution containing an N-alkyliminodiacetic acid or its salt, the alkyl having a carbon atom number of 1 to 3.

1-5. The method of item 1-2 above, wherein the pre-washing solution contains the compound represented by formula (1) or (2), or the N-alkyliminodiacetic acid or its salt in an amount of from 0.001 to 1.0% by weight.

1-6. The method of item 1—1 above, further comprising the step of post-washing the developed light sensitive planographic printing plate precursor with post-washing water.

1-7. The method of item 1-2 above, wherein the pre-washing solution is re-circulated and supplied onto the surface of the printing plate precursor through a spray.

1-8. The method of item 1-7 above, wherein the amount of the pre-washing solution to be supplied onto the surface of the printing plate precursor is from 0.5 to 20 liters per $m^2$ of the printing plate precursor.

1-9. The method of item 1-2 above, wherein the temperature of the pre-washing solution is from 15 to 65° C.

1-10. The method of item 1—1 above, wherein the overcoat layer contains polyvinyl alcohol or polyvinyl pyrrolidone.

1-11. The method of item 1—1 above, wherein the developer contains an alkali metal containing compound selected from the group consisting of potassium silicate, sodium silicate, lithium silicate, potassium metasilicate, sodium metasilicate, lithium metasilicate, potassium phosphate, sodium phosphate, lithium phosphate, potassium hydrogenphosphate, sodium hydrogenphosphate, lithium hydrogenphosphate, potassium carbonate, sodium carbonate, lithium carbonate, potassium hydrogen carbonate, sodium hydrogen carbonate, lithium hydrogen carbonate, potassium borate, sodium borate, or lithium borate.

1-12. The method of item 1-11 above, wherein the alkali metal containing compound is potassium silicate or sodium silicate.

1-13. The method of item 1-12 above, wherein the concentration of the silicate in the developer is from 1.0 to 3.0% by weight in terms of $SiO_2$ concentration.

1-14. The method of item 1-11 above, wherein the developer further contains a weak acid having an acid dissociation constant of from 10.0 to 13.2.

1-15. The method of item 1—1 above, wherein the pH of the developer is from more than 8.5 to less than 13.0.

1-16. The method of item 1—1, wherein the overcoat layer contains a compound selected from a compound of formula (1) or (2), and an N-alkyliminodiacetic acid or its salt.

2-1. A method of processing a light sensitive planographic printing plate precursor comprising a support, and provided thereon, a light sensitive layer and an overcoat layer in that order, the method comprising the steps of imagewise exposing the light sensitive planographic printing plate precursor; pre-washing the exposed light sensitive planographic printing plate precursor with a pre-washing water; and developing the pre-washed light sensitive planographic printing plate precursor with a developer; wherein the pre-washing solution is an aqueous solution containing a compound represented by formula (1) above.

2—2. A method of processing a light sensitive planographic printing plate precursor comprising a support, and provided thereon, a light sensitive layer and an overcoat layer in that order, the method comprising the steps of imagewise exposing the light sensitive planographic printing plate precursor; pre-washing the exposed light sensitive planographic printing plate precursor with a pre-washing water; and developing the pre-washed light sensitive planographic printing plate precursor with a developer; wherein the pre-washing solution is an aqueous solution containing an N-alkyliminodiacetic acid or its salt, the alkyl having a carbon atom number of 1 to 3.

2-3. A method of processing a light sensitive planographic printing plate precursor comprising a support, and provided thereon, a light sensitive layer and an overcoat layer in that order, the method comprising the steps of imagewise exposing the light sensitive planographic printing plate precursor; pre-washing the exposed light sensitive planographic printing plate precursor with a pre-washing water; and developing the pre-washed light sensitive planographic printing plate precursor with a developer; wherein the pre-washing solution is an aqueous solution containing a compound represented by formula (2) above.

2-4. A pre-washing solution for pre-washing a light sensitive planographic printing plate precursor comprising a support, and provided thereon, a light sensitive layer and an overcoat layer in that order in a pre-washing step, wherein the pre-washing solution is an aqueous solution containing a compound represented by formula (1) above.

2-5. A pre-washing solution for pre-washing a light sensitive planographic printing plate precursor comprising a support, and provided thereon, a light sensitive layer and an overcoat layer in that order in a pre-washing step, wherein the pre-washing solution is an aqueous solution containing an N-alkyliminodiacetic acid or its salt, the alkyl having a carbon atom number of 1 to 3.

2-6. A pre-washing solution for pre-washing a light sensitive planographic printing plate precursor comprising a support, and provided thereon, a light sensitive layer and an overcoat layer in that order in a pre-washing step, wherein the pre-washing solution is an aqueous solution containing a compound represented by formula (2) above.

The present invention will be detailed below.

In the invention, the pre-washing solution, which is used before development of a light sensitive planographic printing plate precursor, is an aqueous solution containing a compound represented by formula (1) above.

A compound represented by formula (1) above will be explained below.

In formula (1), $A_1$ through $A_4$ may be the same or different, and independently represents —$CH_2OH$, —$PO_3(M_1)_2$, or —COOM, in which M and $M_1$ independently represent a hydrogen atom, an ammonium group, an alkali metal atom (for example, sodium or potassium), or an organic ammonium group. Herein, the organic ammonium group refers to a group in which the hydrogen of the ammonium group is substituted with an alkyl group, an alkenyl group, an aralkyl group or an aryl group, wherein examples thereof include methylammonium, trimethylammonium, tetramethylammonium, vinylammonium, allylammonium, benzylammonium, phenetylammonium, trimethylbenzylammonium, phenylammonium and naphthylammonium. X represents a substituted or unsubstituted alkylene group having a carbon atom number of 2 to 4 or —$(B_1O)_n$—$(B_2)$—, in which $B_1$ and $B_2$ may be the same or different, and independently represent a substituted or unsubstituted alkylene group having a carbon atom number of 1 to 5. Examples of the alkylene group represented by X include ethylene, trimethylene and tetramethylene. Examples of the alkylene group represented by $B_1$ or $B_2$ include methylene, ethylene, and trimethylene. Examples of the substituent in the substituted alkylene group represented by X, $B_1$ or $B_2$ include a hydroxyl group, and an alkyl group having a carbon atom number of 1 to 3 (for example, methyl, ethyl). "n" represents an integer of 1 to 8, and preferably 1 to 4.

Preferred examples of a compound represented by Formula (1) will be listed below, but the invention is not specifically limited thereto.

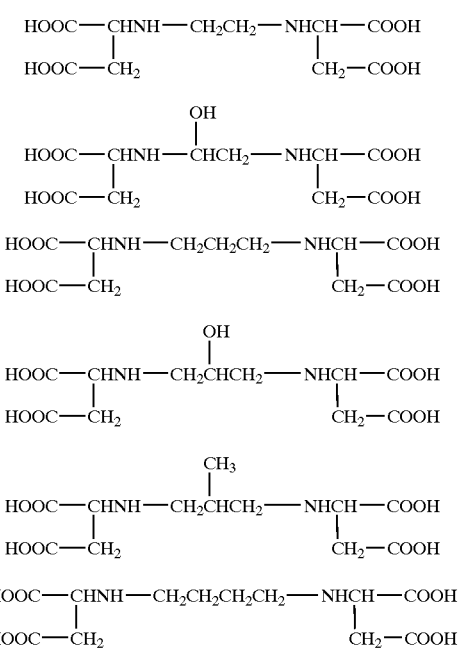

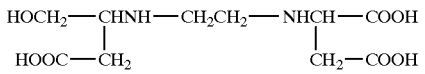

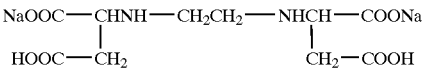

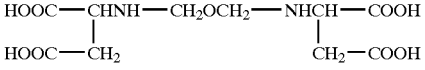

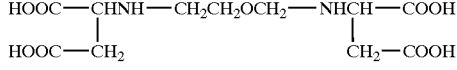

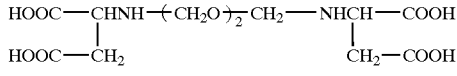

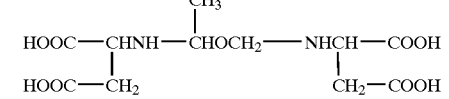

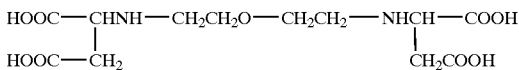

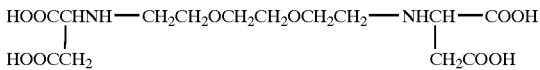

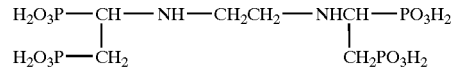

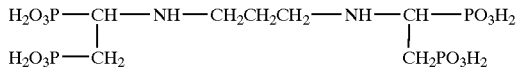

The compound represented by formula (1) can be synthesized according to a synthetic method well known in the art.

Of these, especially preferred compounds are compounds. 1—1, 1-3, and 1-14.

In the invention, the pre-washing solution, which is used before development of a light sensitive planographic printing plate precursor, is an aqueous solution containing an N-alkyliminodiacetic acid or its salt, in which the alkyl has a carbon atom number of 1 to 3.

Examples of the alkyl in the N-alkyliminodiacetic acid or its salt include a methyl group, an ethyl group, propyl group, and an isopropyl group. These alkyl groups include those having a hydroxyl group as a substituent, and the number of hydroxyl group is preferably 1 to 4.

Examples of N-alkyliminodiacetic acid will be listed below, but the invention is not specifically limited thereto.

L-1: N-methyliminodiacetic acid
L-2: N-ethyliminodiacetic acid
L-3: N-hydroxymethyliminodiacetic acid
L-4: N-β-hydroxyethyliminodiacetic acid
L-5: N-propyliminodiacetic acid
L-6: N-α,β-dihydroxyethyliminodiacetic acid
L-7: N-α-hydroxyethyliminodiacetic acid.

Of these compounds, especially preferred compounds are compounds L-1, L-2, and L-3.

The ammonium, potassium or sodium salt of the above compounds can be used.

In the invention, the pre-washing solution, which is used before development of a light sensitive planographic printing plate precursor, is an aqueous solution containing a compound represented by formula (2) above.

The pre-washing solution of the invention contains the compound described above in an amount of preferably from 0.001 to 1.0% by weight, and more preferably from 0.001 to 0.1% by weight. In the invention, the compound of formula (1) is especially preferred.

Next, a developer used in the invention will be explained below.

A developer or developer replenisher used in the light sensitive planographic printing plate precursor in the invention preferably contains at least one compound selected from silicic acid, phosphoric acid, carbonic acid, phenols, saccharides, and fluorinated alcohols.

Of these, weak acid compounds such as phenols, saccharides, oximes, and fluorinated alcohols have an acid dissociation constant (pKa) of preferably from 10.0 to 13.2. Such acid compounds are selected from those described in "IONIZATION CONSTANTS OF ORGANIC ACIDS IN AQUEOUS SOLUTION" published by Pergamon Press Co. Ltd. Examples thereof include phenols having a phenolic hydroxyl group such as salicylic acid (pKa: 13.0), 3-hydroxy-2-naphthoic acid (pKa: 12.84), catechol (pKa: 12.6), gallic acid (pKa: 12.4), sulfosalicylic acid (pKa: 11.7), 3,4-dihydroxysulfosalicylic acid (pKa: 12.2), 3,4-dihydroxybenzoic acid (pKa: 11.94), 1,2,4-trihydroxybenzene (pKa: 11.82), hydroquinone (pKa: 11.56), pyrogallol (pKa: 11.34), o-cresol (pKa: 10.33), resorcinol (pKa: 11.27), p-cresol (pKa: 10.27), and m-cresol (pKa: 10.09).

As the saccharides, non-reducing saccharides, which are stable in an alkali solution, are preferably used. The non-reducing saccharides are those which do not have a free aldehyde group or ketone group, and therefore do not have reducibility. They are classified into trehalose type oligosaccharides in which monosaccharides combine with each other through the reducing groups, glycosides in which saccharides combine with another compound through their reducing group, and sugar alcohols obtained by reducing saccharides, each of which can be suitably used in the invention. Examples of the trehalose type oligosaccharide include trehalose and saccharose. Examples of the glycosides include alkyl glycosides, phenol glycosides, and mustard oil glycoside. Examples of the sugar alcohols include D,L-arabitol, ribitol, xylitol, D,L-sorbitol, D,L-mannitol, D,L-iditol, D,L-talitol, D,L-dulcitol, and D,L-allodulcitol. Maltitol obtained by hydrogenation of disaccharides or reduced oligosaccharides (reduced starch syrup) obtained by hydrogenation of oligosaccharides are suitably used. Examples of the oximes include 2-butanoneoxime (pKa: 12.45), acetoxime (pKa: 12.42), 1,2-cycloheptanedioxime (pKa: 12.3), 2-hydroxybenzaldehideoxime (pKa: 12.10), dimethylglyoxime (pKa: 12.9), ethanediamidedioxime (pKa: 11.37), acetophenoneoxime (pKa: 11.35). Examples of the fluorinated alcohols include 2,2,3,3-tetrafluoropropanol-1 (pKa: 12.74), trifluoroethanol (pKa: 12.37), and trichloroethanol (pKa: 12.24). Further, aldehydes, nucleic acid related substances or other weak acids are used. Examples of the aldehydes include pyridine-2-aldehyde (pKa: 12.68) and pyridine-4-aldehyde (pKa: 12.05), Examples of the nucleic acid related substances include adenosine (pKa: 12.56), inosine (pKa: 12.5), guanine (pKa: 12.3), cytosine (pKa: 12.2), hypoxanthine (pKa: 12.1), and xanthine (pKa: 11.9). Examples of the other weak acids include diethylaminomethylsulfonic acid (pKa: 12.32), 1-amino-3,3,3-trifluorobenzoic acid (pKa: 12.29), isopropylidenedisulfonic acid (pKa: 12.10), 1,1-ethylidenediphosphonic acid (pKa: 11.54), 1,1-diethylidenedisulfonic acid-1-hydroxy (pKa: 11.52), benzimidazole (pKa: 12.86), thiobenzamide (pKa: 12.8), picolinthioamide (pKa: 12.55), and barbituric acid (pKa: 12.5). These acid compounds can be used singly or as a mixture of two or more thereof. Of these compounds, silicic acid, phosphoric acid, sulfosalicylic acid, salicylic acid, sugar alcohol, and saccharose are preferred, and silicic acid, D-sorbitol, saccharose, and reduced starch syrup are particularly preferred, since they are inexpensive and show buffering action in appropriate pH regions.

These weak acid compounds are contained in the developer or developer replenisher in an amount of preferably from 0.1 to 30% by weight, and more preferably from 1 to 20% by weight. The content of the weak acid compound falling within the range described above is advantageous in buffering effect, degree of concentration and manufacturing cost.

In the invention, alkali agents used in combination with the above acid compounds include sodium hydroxide, potassium hydroxide, ammonium hydroxide and lithium hydroxide. These alkali agents may be used singly or in combination.

The developer with a pH of from more than 8.5 to less than 13.0 is preferred in weakness in skin irritation and in ease of handling. Further, the developer with a pH of from more than 8.5 to less than 13.0 provides a printing plate with high printing durability, and high chemical resistance, which shows high resistance at image portions of the printing plate to chemicals such as ink cleaning agent or a plate cleaner.

Other examples of the alkali agents in the invention include potassium silicate, sodium silicate, lithium silicate, ammonium silicate, potassium metasilicate, sodium metasilicate, lithium metasilicate, ammonium metasilicate, potassium phosphate, sodium phosphate, lithium phosphate, ammonium phosphate, potassium hydrogenphosphate, sodium hydrogenphosphate, lithium hydrogenphosphate, ammonium hydrogenphosphate, potassium carbonate, sodium carbonate, lithium carbonate, ammonium carbonate, potassium hydrogencarbonate, sodium hydrogencarbonate, lithium hydrogencarbonate, ammonium hydrogencarbonate, potassium borate, sodium borate, lithium borate, and ammonium borate.

In order to adjust pH of the developer, sodium hydroxide, potassium hydroxide, ammonium hydroxide and lithium hydroxide can be used. Organic alkali agents, including monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine, and pyridine, are also used in combination with the above compounds. The preferred alkali agent is potassium silicate or sodium silicate. The concentration of silicate in the developer is preferably from 1.0 to 3.0% by weight in terms of $SiO_2$ concentration. The ratio by mole ($SiO_2$/M) of $SiO_2$ to alkali metal M is preferably from 0.25 to 2.

The developer in the invention refers to a developer (so-called working developer) replenished with developer replenisher in order to maintain activity of the developer which lowers during development of light sensitive planographic printing plate precursor, as well as fresh developer used at the beginning of development. The developer replenisher is required to be higher in activity (for example, in alkali agent concentration) than the working developer, and may have a pH exceeding 13.0.

Various surfactants or organic solvents can be optionally added to a developer or a developer replenisher used in the invention, in order to accelerate development, disperse smuts occurring during development, or enhance ink receptivity at the image portions of a printing plate. Preferred examples of the surfactant include an anionic surfactant, a cationic surfactant, a nonionic surfactant, and an amphoteric surfactant. Examples of the nonionic surfactant include polyoxyethylenealkyl ethers, polyoxyethylenealkylphenyl ethers, polyoxyethylene-polystyrylphenyl ethers, polyoxyethylenepolyoxypropylenalkyl ethers, partial esters of glycerin and fatty acids, partial esters of sorbitan and fatty acids, partial esters of pentaerythritol and fatty acids, propylene glycol monofatty acid ester, partial esters of sucrose and fatty acids, partial esters of polyoxyethylenesorbitan and fatty acids, partial esters of polyoxyethylenesorbitol and fatty acids, esters of polyoxyethylene glycol and fatty acids, partial esters of polyglycerin and fatty acids, polyoxyethylene castor oil, partial esters of polyoxyethyleneglycerin and fatty acids, polyoxyethylene-polyoxypropylene block copolymer, adduct of polyoxyethylene-polyoxypropylene block copolymer with ethylene imine, fatty acid diethanolamides, N,N-bis-2-hydroxyalkylamines, polyoxyethylenealkylamines, triethanolamine fatty acid esters, and trialkylamine oxides. Examples of the anionic surfactant include fatty acid salts, abietic acid salts, hydroxyalkane sulfonic acid salts, alkane sulfonic acid salts, dialkylsulfosuccinic acid salts, straight-chained alkylbenzene sulfonic acid salts, branched alkylbenzene sulfonic acid salts, alkylnaphthalene sulfonic acid salts, alkyldiphenylether sulfonic acid salts, alkylphenoxypolyoxyethylenepropyl sulfonic acid salts, polyoxyethylenealkyl sulfophenylether salts, N-methyl-N-oleiltaurine sodium salts, N-alkylsulfosuccinic acid monoamide disodium salts, petroleum sulfonic acid salts, nitrated castor oil, sulfated beef tallow, fatty acid alkyl ester sulfate salts, alkylsulfate salts, polyoxyethylenealkylethersulfate salts, fatty acid monoglyceride sulfate salts, polyoxyethylenealkylphenylethersulfate salts, polyoxyethylenestyrylphenylethersulfate salts, alkylphosphate salts, polyoxyethylenealkyletherphosphate salts, polyoxyethylenealkylphenyletherphosphate salts, partial saponification products of styrene-maleic anhydride copolymers, partial saponification products of olefin-maleic anhydride copolymers, and condensates of naphthalene sulfonic acid salts with formalin. Examples of the cationic surfactant include alkylamine salts, quaternary ammonium salts such as tetrabutylammonium bromide, polyoxyethylene alkylamine salts, and polyethylene polyamine derivatives. Examples of the amphoteric surfactant include carboxybetains, aminn carboxylic acids, sulfobetaines, aminosulfates and imidazolines. The "polyoxyethylene" described above can be replaced with polyoxyalkylene such as polyoxymethylene, polyoxypropylene, or polyoxybutylene. A more preferred surfactant is a fluorine-containing surfactant having a perfluoroalkyl group in the molecule. Examples thereof include anionic surfactants such as perfluoroalkylcarboxilic acid salts, or perfluoroalkylsurfuric acid salts, amphoteric surfactants such as perfluorobetaines, cationic surfactants such as perfluoroalkyltrimethylammonimum chlorides, and nonionic surfactants such as perfluoroalkylamineoxides, perfluoroalkylethyleneoxide adducts, oligomers having a perfluoroalkyl group and a hydrophilic group, oligomers having a perfluoroalkyl group and an oleophilic group, oligomers having a perfluoroalkyl group, a hydrophilic group, and an oleophilic group, and urethanes having a perfluoroalkyl group and an oleophilic group. These surfactants can be used singly or as a mixture of two or more thereof. The developer preferably contains the surfactant in an amount of preferably from 0.001 to 5% by weight.

The developer or developer replenisher used in the invention optionally contains a development stabilizing agent. The preferred examples of the development stabilizing agent include an adduct of sugar alcohol with polyethylene glycol, tetraalkylammonium hydroxide such as tetrabutylammonium hydroxide, a phosphonium salt such as tetrabutylphosphonium bromide, and an iodonium salt such as diphenyliodonium chloride, as disclosed in Japanese Patent O.P.I. Publication No. 6-282079. Examples of the development stabilizing agent include anionic surfactants or amphoteric surfactants disclosed in Japanese Patent O.P.I. Publication No. 50-51324, water soluble cationic polymers disclosed in Japanese Patent O.P.I. Publication No. 55-95946, and water soluble amphoteric surfactants disclosed in Japanese Patent O.P.I. Publication No. 56-142528. Further, the examples include organic boron-containing compound to which alkylene glycol is added, disclosed in Japanese Patent O.P.I. Publication No.59-84241, polyoxyethylene-polyoxypropylene block polymer type water-soluble surfactant, disclosed in Japanese Patent O.P.I. Publication No.60-111264, an alkylenediamine compound having polyoxyethylene-polyoxypropylene, disclosed in Japanese Patent O.P.I. Publication No.60-129750, polyoxyethylene, glycol with an average weight molecular weight of not less than 300 disclosed in Japanese Patent O.P.I. Publication No.61-215554, a fluorine-containing surfactant having a cationic group disclosed in Japanese Patent O.P.I. Publication No.63-175858, and a water soluble ethyleneoxide adduct obtained by adding ethyleneoxy to an acid or an alcohol, or water soluble polyalkylenesi disclosed in Japanese Patent O.P.I. Publication No.2-39157.

Organic solvents are optionally added to a developer or a developer replenisher. The organic solvent is a solvent having a solubility in water of suitably 10 weight % or less, and preferably 5 weight % or less. Examples of the organic solvent include 1-phenylethanol, 2-phenylethanol, 3-phenyl-1-propanol, 4-phenyl-1-butanol, 1-phenyl-2-butanol, 2-phonoxyethanol, 2-benzyloxyethanol, o-methoxybenzylalcohol, m-methoxybenzylalcohol, p-methoxybenzylalcohol, benzylalcohol, cyclohexanol, 2-methylcyclohexanol, 3-methylcyclohexanol, 4-methylcyclohexanol, N-phenylethanolamine, and N-phenyldiethanolamine. The organic solvent content of the working developer is preferably 0.1 to 5 weight %. It is preferred that the organic solvent content is not substantially contained in the developer or developer replenisher. The term "not substantially contained" means that the organic solvent is contained in an amount of not more than 1% by weight.

A reducing agent is optionally added to the developer or developer replenisher used in the invention. This is added in order to prevent occurrence of stains on the printing plate during printing. The addition is particularly effective in developing a negative working light sensitive planographic printing plate precursor comprising a light sensitive diazonium compound. Preferred examples of the reducing agent include a phenolic compound such as thiosalicylic acid, hydroquinone, metol, methoxyquinone, resorcine, or 2-methylresorcine, and an amine compound such as phenylenediamine or phenylhydrazine. Preferred examples of the inorganic reducing agent include a sodium, potassium or ammonium salt of an inorganic acid such as sodium sulfite, potassium sulfite, ammonium sulfite, sodium phosphite, potassium phosphite, ammonium phosphite, sodium hydrogen phosphite, potassium hydrogen phosphite, ammonium hydrogen phosphite, sodium thiosulfate, potassium thiosulfate, ammonium thiosulfate, sodium dithionite, potassium dithionite, ammonium dithionite. It is sulfite of these that shows excellent anti-staining effect. The reducing agent content of the developer is preferably 0.05 to 5% by weight.

An organic carboxylic acid is optionally added to the developer or developer replenisher used in the invention. Preferred organic carboxylic acids include an aliphatic carboxylic acid or an aromatic carboxylic acid each having a carbon atom number of from 6 to 20. Examples of the aliphatic carboxylic acid include caproic acid, enanthic acid, caprylic acid, lauric acid, myristic acid, palmitic acid, and stearic acid. Particularly preferred are alkanoic acids having a carbon atom number of from 8 to 12. The acid may be an unsaturated acid having a double bond in the molecule or may have a branched carbon chain. The aromatic carboxylic acid is an aromatic compound such as benzene, naphthalene or anthracene having a carboxyl group. Examples of the aromatic carboxylic acid include o-chlorobenzoic acid, p-chlorobenzoic acid, o-hydroxybenzoic acid, p-hydroxybenzoic acid, o-aminobenzoic acid, p-aminobenzoic acid, 2,4-dihydroxybenzoic acid, 2,5-dihydroxybenzoic acid, 2,6-dihydroxybenzoic acid, 2,3-dihydroxybenzoic acid, 3,5-dihydroxybenzoic acid, gallic acid, 1-hydroxy-2-naphthoic acid, 3-hydroxy-2-naphthoic acid, 2-hydroxy-1-naphthoic acid, 1-naphthoic acid, and 2-naphthoic acid. Hydroxy naphthoic acids are especially preferred. These carboxylic acids are preferably used in the salt form, for example as the sodium salts, potassium salts or ammonium salts, in order to increase the water solubility. The carboxylic acid content of the developer is not specifically limited, and is preferably from 0.1 to 10% by weight, and more preferably from 0.5 to 4% by weight.

The developer or developer replenisher in the invention may contain the following additives in order to increase development performance. Examples of the additives include a neutral salt such as sodium chloride, potassium chloride, potassium bromide, as dislosed in Japanese Patent O.P.I. Publication No. 58-75152, a complex such as [Co (NH$_3$)$_6$]Cl$_3$ as dislosed in Japanese Patent O.P.I. Publication No. 59-121336, an amphoteric polymer such as a copolymer of vinylbenzyltrimethylammonium chloride and sodium acrylate as disclosed in Japanese Patent O.P.I. Publication No. 56-142258, the organic metal containing surfactant containing Si or Ti as disclosed in Japanese Patent O.P.I. Publication No. 59-75255, and the organic boron containing compound disclosed in Japanese Patent O.P.I. Publication No. 59-84241.

The developer or developer replenisher in the invention can further contain an antiseptic agent, a coloring agent, a viscosity increasing agent, an antifoaming agent, or a water softener. Examples of the antifoaming agent include mineral oil, vegetable oil, alcohols, surfactants, and silicon oil. The water softeners include polyphosphoric acid or its sodium, potassium or ammonium salt; aminopolycarboxylic acids or their salts such as ethylenediaminetetraacetic acid or its sodium, potassium or ammonium salt, diethylenetriaminepentaacetic acid or its sodium, potassium or ammonium salt, triethylenetetraminehexaacetic acid or its sodium, potassium or ammonium salt, hydroxyethylethylene-diaminetriacetic acid or its sodium, potassium or ammonium salt, nitrilotriacetic acid or its sodium, potassium or ammonium salt, 1,2-diaminocyclohexane-tetraacetic acid or its sodium, potassium or ammonium salt, 1,3-diamino-2-propanoltetraacetic acid or its sodium, potassium or ammonium salt; and phosphonic acids or their salts such as aminotri(methylenephosphonic acid) or its sodium, potassium or ammonium salt, ethylenediaminetetra (methylenephosphonic acid) or its sodium, potassium or ammonium salt, diethylenetriaminepenta (methylenephosphonic acid) or its sodium, potassium or ammonium salt, triethylenetetraminehexa (methylenephosphonic acid) or its sodium, potassium or ammonium salt, hydroxyethylethylenediaminetri (methylenephosphonic acid) or its sodium, potassium or ammonium salt, and 1-hydroxyethane-1,1-diphosphonic acid or its sodium, potassium or ammonium salt. The water softener content of the developer varies on hardness or amount of a hard water used, but the content is preferably 0.01 to 5 weight %, and more preferably 0.01 to 0.5 weight %.

The developer or developer replenisher used in the invention is an aqueous concentrated solution with a low water content, which is diluted with water and used for development. The aqueous concentrated solution is advantageous in view of its transport. The degree of concentration of the concentrated solution is such that the components contained in the solution are not separated nor precipitated. The concentrated solution may contain a solubilizing agent. As the solubilizing agent is preferred toluene sulfonic acid, xylene sulfonic acid, or their alkali metal salt, which is disclosed in Japanese Patent O.P.I. Publication No. 6-32081.

It is preferred that is attached to the development section B. It is preferred that the automatic developing machine comprises a means for automatically replenishing a developer replenisher in a necessary amount to a developer bath, a means for discharging any excessive developer, a means for automatically replenishing water in necessary amounts to a developer bath, a means for detecting a transported planographic printing plate precursor, a means for calculating the area of the planographic printing plate precursor based on the detection, a means for controlling the replenishing amount or replenishing timing of a developer replenisher or water based on the detection and calculation, a means for controlling temperature of developer, a means for detecting a pH or electric conductivity of developer, and a means for controlling the replenishing amount or replenishing timing of a developer replenisher or water based on the detected pH or electric conductivity.

The automatic developing machine used in the invention may have a pre-washing tank, upstream a developer bath, in which a light sensitive planographic printing plate precursor is immersed in a pre-washing solution. The pre-washing tank is preferably equipped with a spray for spraying water onto the surface of a light sensitive planographic printing plate precursor, more preferably with a means for controlling the temperature of the washing water to fall within the range of 20 to 60° C., and still more preferably a means for brushing the surface of the printing plate precursor, which is a brush in the roll form.

The light sensitive planographic printing plate precursor developed with the developer described above is subjected to post-processing. The post-processing step comprises post-processing the developed precursor with a post-processing solution such as washing water, a rinsing solution containing a surfactant, a finisher or a protective gumming solution containing gum arabic or starch derivatives as a main component.

The post-processing step is carried out employing an appropriate combination of the post-processing solution described above. For example, a method is preferred in which a developed planographic printing plate precursor is post-washed with washing water, and then processed with a rinsing solution containing a surfactant, or a developed planographic printing plate precursor is post-washed with washing water, and then processed with a finisher, since it reduces fatigue of the rinsing solution or the finisher. It is preferred that a multi-step countercurrent processing is carried out employing a rinsing solution or a finisher. The post-processing is carried out employing an automatic developing machine having a development section and a post-processing section.

In the post-processing step, the developed printing plate is sprayed with the post-processing solution from a spray nozzle or is immersed into the post-processing solution in a post-processing tank.

A method is known in which supplies a small amount of water onto the developed printing plate precursor to wash the precursor, and reuses the water used for washing as a dilution water of a concentrated developer. In the automatic developing machine, a method is applied in which each processing solution is replenished with the respective processing replenisher according to the area of the printing plate precursor to have been processed or the operating time of the machine. A method (use-and-discard method) can be applied in which the developed precursor is processed with fresh processing solution and discarded.

The thus obtained planographic printing plate is mounted on a printing press, and printing is carried out.

In the invention, the pre-washing solution used before development can contain a chelating agent, a surfactant or an antiseptic agent. As the solvent, water (for example, tap water) can be used.

The chelating agent is a compound capable of co-ordinate bonding with a metal ion to form a chelate compound. Examples thereof include ethylenediaminetetraacetic acid or its sodium, or potassium salt, triethylenetetramine-hexaacetic acid or its sodium, or potassium salt, hydroxy-ethylethylenediaminetriacetic acid or its sodium or potassium salt, nitrilotriacetic acid or its sodium or potassium salt, 1-hydroxyethane-1,1-diphosphonic acid or its sodium or potassium salt, aminotri(methylenephosphonic acid) or its sodium or potassium salt, and phosphonoalkane tricarboxylic acid or its sodium or potassium salt. The chelating agent content of the pre-washing solution is preferably from 0.0001 to 3.0% by weight.

As the surfactant, any surfactant such as anionic, nonionic, cationic or amphoteric surfactant can be used. The anionic or nonionic surfactant is preferred. A preferred surfactant used is different due to composition of an overcoat layer or a light sensitive layer of light sensitive planographic printing plate precursor to be processed. Generally, a surfactant, which promotes dissolution of overcoat layer but has no influences on solubility to light sensitive layer, is preferred.

Examples of the anionic surfactant include fatty acid salts, abietic acid salts, hydroxyalkane sulfonic acid salts, alkane sulfonic acid salts, dialkylsulfosuccinic acid salts, straight-chained alkylbenzene sulfonic acid salts, branched alkylbenzene sulfonic acid salts, alkylnaphthalene sulfonic acid salts, alkyldiphenylether sulfonic acid salts, alkylphenoxy-polyoxyethylenepropyl sulfonic acid salts, polyoxyethylene-alkyl sulfophenylether salts, N-methyl-N-oleiltaurine sodium salts, N-alkylsulfosuccinic acid monoamide disodium salts, petroleum sulfonic acid salts, nitrated castor oil, sulfated beef tallow, fatty acid alkyl ester sulfate salts, alkylsulfate salts, polyoxyethylenealkylethersulfate salts, fatty acid monoglyceride sulfate salts, polyoxyethylenealkylphenylethersulfate salts, polyoxyethylenestyrylphenylethersulfate salts, alkylphosphate salts, polyoxyethylene-alkyletherphosphate salts, polyoxyethylenealkylphenyletherphosphate salts, partial saponification products of styrene-maleic anhydride copolymers, partial saponification products of olefin-maleic anhydride copolymers, and condensates of naphthalene sulfonic acid salts with formalin.

Examples of the nonionic surfactant include polyoxyethylenealkyl ethers, polyoxyethylenealkylphenyl ethers, polyoxyethylene-polystyrylphenyl ethers, polyoxyethylene-polyoxypropylenalkyl ethers, partial esters of glycerin and fatty acids, partial esters of sorbitan and fatty acids, partial esters of pentaerythritol and fatty acids, propylene glycol monofatty acid ester, partial esters of sucrose and fatty acids, partial esters of polyoxyethylenesorbitan and fatty acids, partial esters of polyoxyethylenesorbitol and fatty acids, esters of polyoxyethylene glycol and fatty acids, partial esters of polyglycerin and fatty acids, polyoxyethylene castor oil, partial esters of polyoxyethyleneglycerin and fatty acids, polyoxyethylene-polyoxypropylene block copolymer, adduct of polyoxyethylene-polyoxypropylene block copolymer with ethylene imine, fatty acid diethanolamides, N,N-bis-2-hydroxyalkylamines, polyoxyethylenealkylamines, triethanolamine fatty acid esters, and trialkylamine oxides.

The surfactant content of the pre-washing solution is preferably from 0.005 to 10% by weight.

Examples of the antiseptic agent include phenol or its derivative, formalin, imidazole derivatives, sodium dehydroacetate, 4-isothiazoline-3-one derivatives, benzoisothiazoline-3-one derivatives, benzotriazole derivatives, amidine guanidine derivatives, quaternary ammonium salts, pyrroline derivatives, quinoline derivatives, guanidine derivatives, diazine derivatives, triazole derivatives, oxazole derivatives, and oxazine derivatives.

Temperature of the pre-washing solution used in the pre-washing step before development is preferably controlled, and the temperature is preferably from 20 to 60° C. As a method for pre-washing a planographic printing plate precursor is used a known method such as a spraying method, a dipping method or a coating method. Further, a wash promoting means is suitably used. Examples of the wash promoting means include a brush, a squeegeeing roller, or a shower-in-solution in the dipping method.

The pre-washing in the invention is preferably carried out supplying the pre-washing solution in the invention onto the surface of the light sensitive planographic printing plate precursor. The amount of the pre-washing solution to be supplied onto the surface of the planographic printing plate precursor is preferably from 0.5 to 20 liters per 1 $m^2$ of planographic printing plate precursor. Supplying the pre-washing solution onto the surface of the light sensitive planographic printing plate precursor is preferably carried out according to a spraying method employing a spray. It is preferred that the pre-washing solution is re-circulated and supplied onto the planographic printing plate precursor surface. Re-circulation is carried out employing a pump.

In the invention, development may be carried but immediately after pre-washing, or after pre-washing and then drying. After the development, a known post-processing such as water washing (post-washing), rinsing or gumming is carried out.

The light sensitive planographic printing plate precursor in the invention will be explained below.

The light sensitive planographic printing plate precursor in the invention comprises a support and provided thereon, a photopolymerizable light sensitive layer (hereinafter referred to also as a light sensitive layer) containing an ethylenically unsaturated monomer, a photopolymerization initiator, and a polymer binder as main components.

Next, main constitution of the light sensitive planographic printing plate precursor in the invention and an image formation method will be explained in detail below.

(Support)

As a support used in the light sensitive planographic printing plate precursor in the invention, an aluminum plate is used, which may be a pure aluminum plate or an aluminum alloy plate.

As the aluminum alloy, there can be used various ones including an alloy of aluminum and a metal such as silicon, copper, manganese, magnesium, chromium, zinc, lead, bismuth, nickel, titanium, sodium or iron.

It is preferable that the support in the invention is subjected to degreasing treatment for removing rolling oil prior to surface roughening (graining). The degreasing treatments include degreasing treatment employing solvents such as trichlene and thinner, and an emulsion degreasing treatment employing an emulsion such as kerosene or triethanol. It is also possible to use an aqueous alkali solution such as caustic soda for the degreasing treatment. When an aqueous alkali solution such as caustic soda is used for the degreasing treatment, it is possible to remove soils and an oxidized film which can not be removed by the above-mentioned degreasing treatment alone. When an aqueous alkali solution such as caustic soda is used for the degreasing treatment, the resulting support is preferably subjected to desmut treatment in an aqueous solution of an acid such as phosphoric acid, nitric acid, sulfuric acid, chromic acid, or a mixture thereof, since smut is produced on the surface of the support. The surface roughening methods include a mechanical surface roughening method and an electrolytic surface roughening method electrolytically etching the support surface.

Though there is no restriction for the mechanical surface roughening method, a brushing roughening method and a honing roughening method are preferable. The brushing roughening method is carried out by rubbing the surface of the support with a rotating brush with a brush hair with a diameter of 0.2 to 0.8 mm, while supplying slurry in which volcanic ash particles with a particle size of 10 to 100 $\mu$m are dispersed in water to the surface of the support. The honing roughening method is carried out by ejecting obliquely slurry with pressure applied from nozzles to the surface of the support, the slurry containing volcanic ash particles with a particle size of 10 to 100 $\mu$m dispersed in water. A surface roughening can be also carried out by laminating a support surface with a sheet on the surface of which abrading particles with a particle size of from 10 to 100 $\mu$m was coated at intervals of 100 to 200 $\mu$m and at a density of $2.5 \times 10^3$ to $10 \times 10^3/cm^2$, and applying pressure to the sheet to transfer the roughened pattern of the sheet and roughen the surface of the support.

After the support has been roughened mechanically, it is preferably dipped in an acid or an aqueous alkali solution in order to remove abrasives and aluminum dust, etc. which have been embedded in the surface of the support. Examples of the acid include sulfuric acid, persulfuric acid, hydrofluoric acid, phosphoric acid, nitric acid and hydrochloric acid, and examples of the alkali include sodium hydroxide and potassium hydroxide. Among those mentioned above, an aqueous alkali solution of for example, sodium hydroxide is preferably used. The dissolution amount of aluminum in the support surface is preferably 0.5 to 5 $g/m^2$. After the support has been dipped in the aqueous alkali solution, it is preferable for the support to be dipped in an acid such as phosphoric acid, nitric acid, sulfuric acid and chromic acid, or in a mixed acid thereof, for neutralization.

Though there is no restriction for the electrolytic surface roughening method, a method in which the support is electrolytically surface roughened in an acidic electrolytic solution. Though an acidic electrolytic solution generally used for the electrolytic surface roughening can be used, it is preferable to use an electrolytic solution of hydrochloric acid or that of nitric acid. The electrolytic surface roughening method disclosed in Japanese Patent Publication No. 48-28123, British Patent No. 896,563 and Japanese Patent O.P.I. Publication No. 53-67507 can be used. In the electrolytic surface roughening method, voltage applied is generally from 1 to 50 V, and preferably from 10 to 30 V. The current density used can be selected from the range from 10 to 200 $A/dm^2$, and is preferably from 50 to 150 $A/dm^2$. The quantity of electricity can be selected from the range of from 100 to 5000 $C/dm^2$, and is preferably 100 to 2000 $C/dm^2$. The temperature during the electrolytically surface roughening may be in the range of from 10 to 50° C., and is preferably from 15 to 45° C.

When the support is electrolytically surface roughened by using an electrolytic solution of nitric acid, voltage applied is generally from 1 to 50 V, and preferably from 5 to 30 V. The current density used can be selected from the range from 10 to 200 $A/dm^2$, and is preferably from 20 to 100 $A/dm^2$. The quantity of electricity can be selected from the range of from 100 to 5000 $C/dm^2$, and is preferably 100 to 2000 $C/dm^2$. The temperature during the electrolytically surface roughening may be in the range of from 10 to 50° C., and is preferably from 15 to 45° C. The nitric acid concentration in the electrolytic solution is preferably from 0.1% by weight to 5% by weight. It is possible to optionally add, to the electrolytic solution, nitrates, chlorides, amines, aldehydes, phosphoric acid, chromic acid, boric acid, acetic acid or oxalic acid.

When the support is electrolytically surface roughened by using an electrolytic solution of hydrochloric acid, voltage applied is generally from 1 to 50 V, and preferably from 2 to 30 V. The current density used can be selected from the range from 10 to 200 $A/dm^2$, and is preferably from 50 to 150 $A/dm^2$. The quantity of electricity can be selected from the range of from 100 to 5000 $C/dm^2$, and is preferably 100 to 2000 $C/dm^2$. The temperature during the electrolytically surface roughening may be in the range of from 10 to 50° C., and is preferably from 15 to 45° C. The hydrochloric acid concentration in the electrolytic solution is preferably from 0.1% by weight to 5% by weight.

After the support has been electrolytically surface roughened, it is preferably dipped in an acid or an aqueous alkali solution in order to remove aluminum dust, etc. produced in the surface of the support. Examples of the acid include sulfuric acid, persulfuric acid, hydrofluoric acid, phosphoric acid, nitric acid and hydrochloric acid, and examples of the alkali include sodium hydroxide and potassium hydroxide. Among those mentioned above, the aqueous alkali solution is preferably used. The dissolution amount of aluminum in the support surface is preferably 0.5 to 5 $g/m^2$. After the support has been dipped in the aqueous alkali solution, it is preferable for the support to be dipped in an acid such as phosphoric acid, nitric acid, sulfuric acid and chromic acid, or in a mixed acid thereof, for neutralization.

The mechanical surface roughening and electrolytic surface roughening may be carried out singly, and the mechanical surface roughening followed by the electrolytic surface roughening may be carried out.

After the surface roughening, anodizing treatment may be carried out. There is no restriction in particular for the method of anodizing treatment used in the invention, and known methods can be used. The anodizing treatment forms an anodization film on the surface of the support. For the anodizing treatment there is preferably used a method of applying a current density of from 1 to 10 $A/dm^2$ to an aqueous solution containing sulfuric acid and/or phosphoric acid in a concentration of from 10 to 50%, as an electrolytic solution. However, it is also possible to use a method of applying a high current density to sulfuric acid as described in U.S. Pat. No. 1,412,768, a method to electrolytically etching the support in phosphoric acid as described in U.S. Pat. No. 3,511,661, or a method of employing a solution containing two or more kinds of chromic acid, oxalic acid, malonic acid, etc. The coated amount of the formed anodization film is suitably 1 to 50 $mg/dm^2$, and preferably 10 to 40 $mg/dm^2$. The coated amount of the formed anodization film can be obtained from the weight difference between the aluminum plates before and after dissolution of the anodization film. The anodization film of the aluminum plate is dissolved employing for example, an aqueous phosphoric acid chromic acid solution which is prepared by dissolving 35 ml of 85% by weight phosphoric acid and 20 g of chromium (IV) oxide in 1 liter of water.

The support which has been subjected to anodizing treatment is optionally subjected to sealing treatment. For the sealing treatment, it is possible to use known methods using hot water, boiling water, steam, a sodium silicate solution, an aqueous dicromate solution, a nitrite solution and an ammonium acetate solution.

After the above treatment, the support is suitably undercoated with a water soluble resin such as polyvinyl phosphonic acid, a polymer or copolymer having a sulfonic acid in the side chain, or polyacrylic acid; a water soluble metal salt such as zinc borate; a yellow dye, an amine salt; and so on. The sol-gel treatment support, which has a functional group capable of causing addition reaction by radicals as a covalent bond, is suitably used.

(Addition Polymerizable Ethylenically Unsaturated Monomer)

As an addition polymerizable ethylenically unsaturated monomer (hereinafter also referred to simply as a monomer) in the invention, known monomers can be used.

Examples thereof include a monofunctional acrylate such as 2-ethylhexyl acrylate, 2-hydroxypropyl acrylate, glycerol acrylate, tetrahydrofurfuryl acrylate, phenoxyethyl acrylate, nonylphenoxyethyl acrylate, tetrahydrofurfuryl-oxyethyl acrylate, tetrahydrofurfuryloxyhexanorideacrylate, an ester of 1,3-dioxane-ε-caprolactone adduct with acrylic acid, or 1,3-dioxolane acrylate; a methacrylate, itaconate, crotonate or maleate alternative of the above acrylate; a bifunctional acrylate such as ethyleneglycol diacrylate, triethyleneglycol diacrylate, pentaerythritol diacrylate, hydroquinone diacrylate, resorcin diacrylate, hexanediol diacrylate, neopentyl glycol diacrylate, tripropylene glycol diacrylate, hydroxypivalic acid neopentyl glycol diacrylate, neopentyl glycol adipate diacrylate, diacrylate of hydroxypivalic acid neopentyl glycol-ε-caprolactone adduct, 2-(2-hydroxy-1,1-dimethylethyl)-5-hydroxymethyl-5-ethyl-1,3-dioxane diacrylate, tricyclodecanedimethylol acrylate, tricyclodecanedimethylol acrylate-ε-caprolactone adduct or 1,6-hexanediol diglycidylether diacrylate; a dimethacrylate, diitaconate, dicrotonate or dimaleate alternative of the above diacrylate; a polyfunctional acrylate such as trimethylolpropane triacrylate, ditrimethylolpropane tetraacrylate, trimethylolethane triacrylate, pentaerythritol triacrylate, pentaerythritol tetraacrylate, dipentaerythritol tetraacrylate, dipentaerythritol pentaacrylate, dipentaerythritol hexacrylate, dipentaerythritol hexacrylate-ε-caprolactone adduct, pyrrogallol triacrylate, propionic acid dipentaerythritol triacrylate, propionic acid dipentaerythritol tetraacrylate or hydroxypivalylaldehyde modified dimethylolpropane triacrylate; a methacrylate, itaconate, crotonate or maleate alternative of the above polyfunctional acrylate.

A prepolymer can be used, and examples of the prepolymer include compounds as described later. The prepolymer with a photopolymerizable property, which is obtained by incorporating acrylic acid or methacrylic in an oligomer with an appropriate molecular weight, can be suitably employed. This prepolymer can be used singly, as an admixture of the above described monomers and/or oligomers.

Examples of the prepolymer include polyester (meth) acrylate obtained by incorporating (meth)acrylic acid in a polyester of a polybasic acid such as adipic acid, trimellitic acid, maleic acid, phthalic acid, terephthalic acid, hymic acid, malonic acid, succinic acid, glutaric acid, itaconic acid, pyromellitic acid, fumalic acid, pimelic acid, sebatic acid, dodecanic acid or tetrahydrophthalic acid with a polyol such as ethylene glycol, ethylene glycol, diethylene glycol, propylene oxide, 1,4-butane diol, triethylene glycol, tetraethylene glycol, polyethylene glycol, grycerin, trimethylol propane, pentaerythritol, sorbitol, 1,6-hexanediol or 1,2,6-hexanetriol; an epoxyacrylate such as bisphenol A.epichlorhydrin.(meth)acrylic acid or phenol novolak.epichlorhydrin·(meth)acrylic acid obtained by incorporating (meth)acrylic acid in an epoxy resin; an ureathaneacrylate such as ethylene glycol.adipic acid.tolylenediisocyanate.2-hydroxyethylacrylate, polyethylene glycol.tolylenediisocyanate.2-hydroxyethylacrylate, hydroxyethylphthalyl methacrylate.xylenediisocyanate, 1,2-polybutadieneglycol.tolylenediisocyanate.2-hydroxyethylacrylate or trimethylolpropane.propylene glycol.tolylenediisocyanate.2-hydroxyethylacrylate, obtained by incorporating (meth)acrylic acid in an urethane resin; a silicone acrylate such as polysiloxane acrylate, or polysiloxane.diisocyanate.2-hydroxyethylacrylate; an alkyd modified acrylate obtained by incorporating a methacroyl group in an oil modified alkyd resin; and a spiran resin acrylate.

The light sensitive layer in the invention may contain a monomer such as a phosphazene monomer, triethylene glycol, an EO modified isocyanuric acid diacrylate, an EO modified isocyanuric acid triacrylate, dimethyloltricyclodecane diacrylate, trimethylolpropane acrylate benzoate, an alkylene glycol acrylate, or a urethane modified acrylate, or an addition polymerizable oligomer or prepolymer having a structural unit derived from the above monomer.

The ethylenic monomers used in the invention include a phosphate compound having at least one (meth)acryloyl group. The phosphate compound is a compound having a (meth)acryloyl group in which at least one hydroxyl group of phosphoric acid is esterified, and the phosphate compound is not limited as long as it has a (meth)acryloyl group.

Besides the above compounds, compounds disclosed in Japanese Patent O.P.I. Publication Nos. 58-212994, 61-6649, 62-46688, 62-48589, 62-173295, 62-187092, 63-67189, and 1-244891, compounds described on pages 286 to 294 of "11290 Chemical Compounds" edited by Kagakukogyo Nipposha, and compounds described on pages 11 to 65 of "UV.EB Koka Handbook (Materials)" edited by Kobunshi Kankokai can be suitably used. Of these compounds, compounds having two or more acryl or methacryl groups in the molecule are preferable, and those having a molecular weight of not more than 10,000, and preferably not more than 5,000 are more preferable.

The light sensitive layer in the invention contains the monomer described above in an amount of preferably 1.0 to 80.0% by weight, and more preferably 3.0 to 70.0% by weight.

(Polymer Binder)

In the light sensitive planographic printing plate precursor of the invention, the photopolymerizable light sensitive layer contains a polymer binder.

As the polymer binder can be used a vinyl copolymer, an acrylic polymer (including an acrylic copolymer, a polyvinylbutyral resin, a polyurethane resin, a polyamide resin, a polyester resin, an epoxy resin, a phenol resin, a polycarbonate resin, a polyvinyl butyral resin, a polyvinyl formal resin, a shellac resin, or another natural resin. These resins can be used as an admixture of two or more thereof.

As the polymer binder described above, the vinyl copolymer is preferred, and a vinyl copolymer, obtained by copolymerization of an acryl monomer, is more preferred. The most preferred vinyl copolymer is a copolymer containing both (a) a carboxyl group-containing monomer unit and (b) an alkyl methacrylate or alkyl acrylate unit as the copolymerization component.

Examples of the carboxyl group-containing monomer include an α, β-unsaturated carboxylic acid, for example, acrylic acid, methacrylic acid, maleic acid, maleic anhydride, itaconic acid, itaconic anhydride or a carboxylic acid such as a half ester of phthalic acid with 2-hydroxymethacrylic acid.

Examples of the alkyl methacrylate or alkyl acrylate include an unsubstituted alkyl ester such as methylmethacrylate, ethylmethacrylate, propylmethacrylate, butylmethacrylate, amylmethacrylate, hexylmethacrylate, heptylmethacrylate, octylmethacrylate, nonylmethacrylate, decylmethacrylate, undecylmethacrylate, dodecylmethacrylate, methylacrylate, ethylacrylate, propylacrylate, butylacrylate, amylacrylate, hexylacrylate, heptylacrylate, octylacrylate, nonylacrylate, decylacrylate, undecylacrylate, or dodecylacrylate; a cyclic alkyl ester such as cyclohexyl methacrylate or cyclohexyl acrylate; and a substituted alkyl ester such as benzyl methacrylate, 2-chloroethyl methacrylate, N,N-dimethylaminoethyl methacrylate, glycidyl methacrylate, benzyl acrylate, 2-chloroethyl acrylate, N,N-dimethylaminoethyl acrylate or glycidyl acrylate.

The polymer binder in the invention can further contain, as another monomer unit, a monomer unit derived from the monomer described in the following items (1) through (14):

(1) A monomer having an aromatic hydroxy group, for example, o-, (p- or m-) hydroxystyrene, or o-, (p- or m-) hydroxyphenylacrylate;

(2) A monomer having an aliphatic hydroxy group, for example, 2-hydroxyethyl acrylate, 2-hydroxyethyl methacrylate, N-methylolacrylamide, N-methylolmethacrylamide, 4-hydroxybutyl acrylate, 4-hydroxybutyl methacrylate, 5-hydroxypentyl acrylate, 5-hydroxypentyl methacrylate, 6-hydroxyhexyl acrylate, 6-hydroxyhexyl methacrylate, N-(2-hydroxyethyl)acrylamide, N-(2-hydroxyethyl)methacrylamide, or hydroxyethyl vinyl ether;

(3) A monomer having an aminosulfonyl group, for example, m- or p-aminosulfonylphenyl methacrylate, m- or p-aminosulfonylphenyl acrylate, N-(p-aminosulfonylphenyl) methacrylamide, or N-(p-aminosulfonylphenyl)acrylamide;

(4) A monomer having a sulfonamido group, for example, N-(p-toluenesulfonyl)acrylamide, or N-(p-toluenesulfonyl)-methacrylamide;

(5) An acrylamide or methacrylamide, for example, acrylamide, methacrylamide, N-ethylacrylamide, N-hexylacrylamide, N-cyclohexylacrylamide, N-phenylacrylamide, N-nitrophenylacrylamide, N-ethyl-N-phenylacrylamide, N-4-hydroxyphenylacrylamide, or N-4-hydroxyphenylmethacrylamide;

(6) A monomer having a fluorinated alkyl group, for example, trifluoromethyl acrylate, trifluoromethyl methacrylate, tetrafluoropropyl methacrylate, hexafluoropropyl methacrylate, octafluoropentyl acrylate, octafluoropentyl methacrylate, heptadecafluorodecyl methacrylate, heptadecafluorodecyl methacrylate, or N-butyl-N-(2-acryloxyethyl) heptadecafluorooctylsulfonamide;

(7) A vinyl ether, for example, ethyl vinyl ether, 2-chloroethyl vinyl ether, propyl vinyl ether, butyl vinyl ether, octyl vinyl ether, or phenyl vinyl ether;

(8) A vinyl ester, for example, vinyl acetate, vinyl chroloacetate, vinyl butyrate, or vinyl benzoate;

(9) A styrene, for example, styrene, methylstyrene, or chloromethystyrene;

(10) A vinyl ketone, for example, methyl vinyl ketone, ethyl vinyl ketone, propyl vinyl ketone, or phenyl vinyl ketone;

(11) An olefin, for example, ethylene, propylene, isobutylene, butadiene, or isoprene;

(12) N-vinylpytrrolidone, N-vinylcarbazole, or N-vinylpyridine;

(13) A monomer having a cyano group, for example, acrylonitrile, methacrylonitrile, 2-pentenenitrile, 2-methyl-3-butene nitrile, 2-cyanoethyl acrylate, or o-, m- or p-cyanostyrene;

(14) A monomer having an amino group, for example, N,N-diethylaminoethyl methacrylate, N,N-dimethylaminoethyl acrylate, N,N-dimethylaminoethyl methacrylate, polybutadiene urethane acrylate, N,N-dimethylaminopropyl acrylamide, N,N-dimethylacrylamide, acryloylmorpholine, N-isopropylacrylamide, or N,N-diethylacrylamide.

Further another monomer may be copolymerized with the above monomer. As the polymer binder is also preferred an unsaturated bond-containing copolymer which is obtained by reacting a carboxyl group contained in the above vinyl copolymer molecule with for example, a compound having a (meth)acryloyl group and an epoxy group. Examples of the compound having a (meth)acryloyl group and an epoxy group in the molecule include glycidyl acrylate, glycidyl methacrylate and an epoxy group-containing unsaturated compound disclosed in Japanese Patent O.P.I. Publication No. 11-27196.

The weight average molecular weight of the above copolymer is preferably 10,000 to 200,000 measured by gel permeation chromatography (GPC), but is not limited thereto.

The content of the polymer binder in the photopolymerizable light sensitive layer is preferably from 10 to 90% by weight, more preferably from 15 to 70% by weight, and still more preferably from 20 to 50% by weight in view of sensitivity. The addition amount of the vinyl copolymer described above is preferably from 50 to 100% by weight based on the total addition amount of the polymer binder.

The acid value of the polymer binder is preferably from 10 to 150, more preferably from 30 to 120, and still more preferably from 50 to 90, in view of balance of polarity of the light sensitive layer, which can prevent coagulation of pigment used in the light sensitive layer coating liquid.

(Photopolymerization Initiator)

Preferred examples of the known photopolymerization initiator used in the invention include carbonyl compounds, organic sulfur compounds, peroxides, redox compounds, azo or diazo compounds, halides and photo-reducing dyes disclosed in J. Kosar, "Light Sensitive Systems", Paragraph 5. The compounds disclosed in British Patent No. 1,459,563 are also preferred.

Examples of the photopolymerization initiators will be listed below, but the invention is not specifically limited thereto.

The examples include a benzoin derivative such as benzoin methyl ether, benzoin i-propyl ether, or α,α-dimethoxy-α-phenylacetophenone; a benzophenone derivative such as benzophenone, 2,4-dichlorobenzophenone, o-benzoyl methyl benzoate, or 4,4'-bis (dimethylamino) benzophenone; a thioxanthone derivative such as 2-chlorothioxanthone, 2-i-propylthioxanthone; an anthraquinone derivative such as 2-chloroanthraquinone or 2-methylanthraquinone; an acridone derivative such as N-methylacridone or N-butylacridone; α,α-diethoxyacetophenone; benzil; fluorenone; xanthone; an uranyl compound; a triazine derivative disclosed in Japanese Patent Publication Nos. 59-1281 and 61-9621 and Japanese Patent O.P.I. Publication No. 60-60104; an organic peroxide compound disclosed in Japanese Patent O.P.I. Publication Nos. 59-1504 and 61-243807; a diazonium compound in Japanese Patent Publication Nos. 43-23684, 44-6413, 47-1604 and U.S. Pat. No. 3,567,453; an organic azide compound disclosed in U.S. Pat. Nos. 2,848,328, 2,852,379 and 2,940,853; orthoquinondiazide compounds disclosed in Japanese Patent Publication Nos. 36-22062b, 37-13109, 38-18015 and 45-9610; various onium compounds disclosed in Japanese Patent Publication No. 55-39162, Japanese Patent O.P.I. Publication No. 59-14023 and "Macromolecules", Volume 10, p. 1307 (1977); azo compounds disclosed in Japanese Patent Publication No. 59-142205; metal arene complexes disclosed in Japanese Patent O.P.I. Publication No. 1-54440, European Patent Nos. 109,851 and 126,712, and "Journal of Imaging Science", Volume 30, p. 174 (1986); (oxo) sulfonium organoboron complexes disclosed in Japanese Patent O.P.I. Publication Nos. 5-213861 and 5-255347; titanocenes disclosed in Japanese Patent O.P.I. Publication Nos. 59-152396 and 61-151197; transition metal complexes containing a transition metal such as ruthenium disclosed in "Coordination Chemistry Review", Volume 84, p. 85–277 (1988) and Japanese Patent O.P.I. Publication No. 2-182701; 2,4,5- triarylimidazol dimmer disclosed in Japanese Patent O.P.I. Publication No. 3-209477; carbon tetrabromide; and organic halide compounds disclosed in Japanese Patent O.P.I. Publication No. 59-107344.

A preferred photopolymerization initiator is a titanocene compound. Examples of the titanocene compound include di-cyclopentadienyl-Ti-dichloride, dicyclopentadienyl-Ti-bisphenyl, dicyclopentadienyl-Ti-bis-2,3,4,5,6-pentafluorophenyl, dicyclopentadienyl-Ti-bis-2,3,5,6-tetrafluorophenyl, dicyclopentadienyl-Ti-bis-2,4,6-trifluorophenyl, dicyclopentadienyl-Ti-bis-2, 6difluorophenyl, dicyclopentadienyl-Ti-bis-2,4-difluorophenyl, di-methylcyclopentadienyl-Ti-bis-2,3,4,5,6-pentafluorophenyl, di-methylcyclopentadienyl-Ti-bis-2,3,5, 6-tetrafluorophenyl, di-methylcyclopentadienyl-Ti-bis-2,4-difluorophenyl, and bis (cyclopentadienyl)-bis (2,6-difluoro-3-(pyrryl)phenyl) titanium (IRUGACURE 784, produced by Ciba Specialty Co., Ltd.), but are not limited thereto.

(Sensitizing Dye)

When a laser is employed as a light source, the light sensitive layer in the invention preferably contains a sensitizing dye.

Examples of the sensitizing dyes, which can induce sensitivity to the wavelengths of visible to near infrared regions, include cyanines, phthalocyanines, merocyanines, porphyrins, spiro compounds, ferrocenes, fluorenes, fulgides, imidazoles, perylenes, phenazines, phenothiazines, polyenes, azo compounds, diphenylmethanes, triphenylmethanes, polymethine acridines, cumarines, ketocumarines, quinacridones, indigos, styryl dyes, pyrylium dyes, pyrromethene dyes, pyrazolotriazole compounds, benzothiazole compounds, barbituric acid derivatives, thiobarbituric acid derivatives, and compounds disclosed in European Patent No. 568,993, U.S. Pat. Nos. 4,508,811 and 5,227,227, and Japanese Patent O.P.I. Publication Nos. 2001-125255 and 11-271969.

Examples in which the above polymerization initiators are used in combination with the sensitizing dye are disclosed in Japanese Patent O.P.I. Publication Nos. 2001-125255 and 11-271969.

The content of the photopolymerization initiator is not specifically limited but is preferably from 0.1 to 20 parts by weight based on 100 parts by weight of addition polymerizable ethylenically unsaturated monomer in the light sensitive layer. The content ration of the sensitizing dye to the photopolymerization initiator in the light sensitive layer is preferably from 1:100 to 100:1 by mol.

(Additives)

The coating composition for the light sensitive layer in the invention preferably contains a polymerization inhibitor in addition to the compounds described above, in order to prevent undesired polymerization of the ethylenically double bond-containing monomer during the manufacture or storage of a light sensitive planographic printing plate precursor. Examples of the polymerization inhibitor include hydroquinone, p-methoxyphenol, di-t-butyl-p-cresol, pyrrogallol, t-butylcatechol, benzoquinone, 4,4'-thiobis (3-methyl-6-t-butylphenol), 2,2'-methylenebis (4-methyl-6-t-butylphenol), N-nitrosophenylhydroxylamine cerous salt, and 2-t-butyl-6-(3-t-butyl-6-hydroxy-5-mrthylbenzyl)-4-methylphenyl acrylate.

The polymerization inhibitor content is preferably 0.01 to 5% by weight based on the total solid content of the photopolymerizable light sensitive layer. Further, in order to prevent polymerization induced by oxygen, a higher fatty acid such as behenic acid or a higher fatty acid derivative such as behenic amide may be added to the layer, or may be localized on the surface of the layer in the drying step after coating. The higher fatty acid or higher fatty acid derivative content is preferably 0.5 to 10% by weight based on the total solid content of the photopolymerizable light sensitive layer.

A colorant can be also used. As the colorant can be used known materials including commercially available materials. Examples of the colorant include those described in revised edition "Ganryo Binran", edited by Nippon Ganryo Gijutu Kyoukai (publishe by Seibunndou Sinkosha), or "Color Index Binran".

Kinds of the pigment include black pigment, yellow pigment, red pigment, brown pigment, violet pigment, blue pigment, green pigment, fluorescent pigment, and metal powder pigment. Examples of the pigment include inorganic pigment (such as titanium dioxide, carbon black, graphite, zinc oxide, Prussian blue, cadmium sulfide, iron-oxide, or chromate of lead, zinc, barium or calcium); and organic pigment (such as azo pigment, thioindigo pigment, anthraquinone pigment, anthanthrone pigment, triphenedioxazine pigment, vat dye pigment, phthalocyanine pigment or its derivative, or quinacridone pigment).

Among these pigment, pigment is preferably used which does not substantially have absorption in the absorption wavelength regions of a spectral sensitizing dye used according to a laser for exposure. The absorption of the pigment used is not more than 0.05, obtained from the reflection spectrum of the pigment measured employing an integrating sphere and employing light with the wavelength of the laser used. The pigment content is preferably 0.1 to 10% by weight, and more preferably 0.2 to 5% by weight, based on the total solid content of the photopolymerizable light sensitive layer composition.

When an argon laser (488 nm) or an SHG-YAG laser (532 nm) is used as a light source for exposure, violet pigment or blue pigment is preferably used in view of the above absorption wavelength relationship or image visibility after the exposure. Such pigment examples include Cobalt Blue, cerulean blue, alkali blue lake, Victria Blue lake, metal free phthalocyanine, Phthalocyanine Blue, Fast Sky Blue, Indanthrene Blue, indigo, dioxane violet, isoviolanthrone violet, Indanthrone Blue, and Indanthrene BC. Among these, Phthalocyanine Blue and dioxane violet are preferred.

The above coating composition can contain other additives such as a surfactant as a coatability improving agent, or an inorganic filler or a plasticizer for improving a physical property of the photopolymerizable light sensitive layer, as long as performance of the invention is not jeopardized. The surfactant is preferably a fluorine-contained surfactant.

Examples of the plasticizer include dioctyl phthalate, dimethyl phthalate or tricresyl phosphate. The content of the other additives is preferably not more than 10% by weight, based on the total solid content of the composition.

(Coating)

The light sensitive planographic printing plate precursor in the invention is obtained by preparing a coating liquid in which the photopolymerizable light sensitive composition is dissolved in a solvent, coating the coating liquid on a support to form a photopolymerizable light sensitive layer on the support.

The solvents used in the preparation of the coating liquid for the photopolymerizable light sensitive layer in the invention include an alcohol such as sec-butanol, isobutanol, n-hexanol, or benzyl alcohol; a polyhydric alcohol such as diethylene glycol, triethylene glycol, tetraethylene glycol, or 1,5-pentanediol; an ether such as propylene glycol monobutyl ether, dipropylene glycol monomethyl ether, or tripropylene glycol monomethyl ether; a ketone or aldehyde such as diacetone alcohol, cyclohexanone, or methyl cyclohexanone; and an ester such as ethyl lactate, butyl lactate, diethyl oxalate, or methyl benzoate.

The prepared coating liquid for the photopolymerizable light sensitive layer is coated on the support according to a conventional method, and dried to obtain a light sensitive planographic printing plate precursor. Examples of the coating method include an air doctor coating method, a blade coating method, a wire bar coating method, a knife coating method, a dip coating method, a reverse roll coating method, a gravure coating method, a cast coating method, a curtain coating method, and an extrusion coating method.

A low drying temperature of the coated photopolymerizable light sensitive layer cannot provide sufficient printing durability, while too a high drying temperature of the coated photopolymerizable light sensitive layer results in marangoni and produces fog at non-image portions. The drying temperature is preferably from 60 to 160° C., more preferably from 80 to 140° C., and still more preferably from 90 to 120° C.

The photopolymerizable light sensitive layer in the invention has a dry thickness of preferably from 0.1 to 5 g/m$^2$, and more preferably from 0.5 to 3 g/m$^2$.

(Over Coat Layer or Oxygen Shielding Layer)

In the invention, an over coat layer, an oxygen shielding layer is provided on the photopolymerizable light sensitive layer of the light sensitive planographic printing plate precursor of the invention. It is preferred that the oxygen shielding layer is low in oxygen permeability and highly soluble in the developer as described above (generally an alkaline solution). Polyvinyl alcohol or polyvinyl pyrrolidone is preferably used in the protective layer. Polyvinyl alcohol has the effect of preventing oxygen from transmitting and polyvinyl pyrrolidone has the effect of increasing adhesion between the oxygen shielding layer and the photopolymerizable light sensitive layer adjacent thereto.

Besides the above two polymers, the oxygen shielding layer may contain a water soluble polymer such as polysaccharide, polyethylene glycol, gelatin, glue, casein, hydroxyethyl cellulose, carboxymethyl cellulose, methyl cellulose, hydroxyethyl starch, gum arabic, sucrose octacetate, ammonium alginate, sodium alginate, polyvinyl amine, polyethylene oxide, polystyrene sulfonic acid, polyacrylic acid, or a water soluble polyamide.

In the light sensitive planographic printing plate precursor in the invention, adhesive strength between the oxygen shielding layer (overcoat layer) and the photopolymerizable light sensitive layer is preferably not less than 35 mN/mm, and more preferably not less than 75 mN/mm. Preferred composition of the overcoat layer is disclosed in Japanese Patent O.P.I. Publication No. 10-10742.

The adhesive strength in the invention can be measured according to the following procedure.

When an adhesive tape with sufficient adhesive strength having a predetermined width is adhered onto the overcoat layer, and then peeled at an angle of 90° to the plane of the light sensitive planographic printing plate precursor, strength necessary to peel the overcoat layer from the photopolymerizable light sensitive layer is measured as the adhesive strength.

The overcoat layer may further contain a surfactant or a matting agent. The overcoat layer is formed, coating on the photopolymerizable light sensitive layer a coating solution in which the above overcoat layer composition is dissolved in an appropriate coating solvent, and drying. The main solvent of the coating solution is preferably water or an alcohol solvent such as methanol, ethanol, or iso-propanol.

The thickness of the overcoat layer is preferably 0.1 to 5.0 μm, and more preferably 0.5 to 3.0 μm.

The pre-washing solution in the invention is an aqueous solution containing a compound selected from a compound of formula (1) or (2) and N-alkyliminodiacetic acid or its salt, or is an aqueous solution such that when a light sensitive planographic printing plate precursor comprising an overcoat layer containing the above compound is exposed and pre-washed with water (tap water, for example) in the pre-washing step, the compound is dissolved out into the water to obtain an aqueous solution containing the compound. When the overcoat layer contains the above compound, the content of the above compound in the overcoat layer is preferably 0.001 to 1% by weight, and more preferably from 0.001 to 0.1% by weight.

EXAMPLES

Next, the present invention will be explained employing examples, but the present invention is not limited thereto. In the examples, "parts" represents "parts by weight", unless otherwise specified.

Example 1

Synthesis of Polymer Binder 1

Twelve parts of methacrylic acid, 70 parts of methyl methacrylate, 8 parts of acrylonitrile, 10 parts of ethyl methacrylate, 500 parts of ethanol, and 3 parts of α,α'-azobisisobutylonitrile were put in a three neck flask under nitrogen atmosphere, and reacted under nitrogen atmosphere for 6 hours at 80° C. in an oil bath. After that, 3 parts of triethylammonium chloride and 2 parts of glycidyl methacrylate were added to the resulting reaction mixture, and further reacted for 3 hours. Thus, polymer binder 2 was obtained. The weight average molecular weight of the polymer binder 2 was 50,000, measured according to GPC. The glass transition temperature Tg of the polymer binder 2 was 85° C., measured according to DSC (differential thermal analysis).

(Preparation of Support)

A 0.24 mm thick aluminum plate (material 1050, quality H16) was degreased at 60° C. for one minute in a 5% sodium hydroxide solution, washed with water, immersed at 25° C. for one minute in 10% hydrochloric acid solution to neutralize, and then washed with water. The resulting aluminum plate was electrolytically etched using an alternating current at 25° C. for 60 seconds at a current density of 100 A/dm$^2$ in a 0.3 weight % nitric acid solution, desmut at 60° C. for 10 seconds in a 5% sodium hydroxide solution. The desmut aluminum plate was anodized at 25° C. for 1 minute at a current density of 10 A/dm$^2$ and at a voltage of 15 V in a 15% sulfuric acid solution. Thus, support 1 was obtained. The center line average surface roughness of the support was 0.65 μm.

(Preparation of Subbed Support)

The following subbing layer coating liquid was coated on the support obtained above using a wire bar, dried at 90° C. for one minute, and further heated at 110° C. for 3 minutes to give a subbing layer with a dry thickness of 0.1 g/m$^2$. Thus, subbed support was obtained.

| (Subbing layer coating liquid) | |
| --- | --- |
| γ-Methacryloxypropyltrimethoxysilane | 1 part |
| Methyl ethyl ketone | 80 parts |
| Cyclohexanone | 19 parts |

(Preparation of Light Sensitive Planographic Printing Plate Precursor)

The following photopolymerizable light sensitive layer coating liquid was coated on the subbed support using a wire bar, and dried at 95° C. for 1.5 minutes to give a light sensitive layer with a dry thickness of 1.4 g/m$^2$. After that, the following oxygen-shielding layer coating liquid was coated on the light sensitive layer of the resulting plate using an applicator, and dried at 75° C. for 1.5 minutes to obtain an oxygen shielding layer (over coat layer) with a dry thickness of 2.0 g/m$^2$. Thus, a light sensitive planographic printing plate precursor sample was prepared.

| (Photopolymerizable light sensitive layer coating liquid) | |
|---|---|
| Polymer binder 1 | 35 parts |
| Sensitizing Dye 1 described later | 2.0 parts |
| Sensitizing Dye 2 described later | 2.0 parts |
| IRGACURE 784 (produced by Ciba Speciality Co., Ltd.) | 4.0 parts |
| Monomer 1 | 10 parts |
| Monomer 2 | 10 parts |
| Monomer 3 | 20 parts |
| Monomer 4 | 10 parts |
| Phthalocyanine pigment (MHI 454 produced by Mikuni Sikisosha) | 6.0 parts |
| 2-t-butyl-6-(3-t-butyl-2-hydroxy-5-methylbenzyl)-4-methylphenyl acrylate (Sumirizer GS produced by Sumitomo 3M Co., Ltd.) | 0.5 parts |
| Fluorine-contained surfactant (FC-431 produced by Sumitomo 3M Co., Ltd.) | 0.5 parts |
| Methyl ethyl ketone (bp. 79.6° C.) | 80 parts |
| Cyclopentanone (bp. 129° C.) | 820 parts |

The monomers 1 through 4 (ethylenic addition polymerizable group-containing compounds) described above are as follows:

Monomer 1: Ethylene oxide modified tris(acryloxyethyl)-isocyanuric acid (ARONIX M-315, produced by To a Gosei Co., Ltd.)

Monomer 2: Polytetramethylene glycol diacrylate (PTMGA-250, produced by Kyoeisha Chemical Co., Ltd.)

Monomer 3: polyfunctional urethane acrylate (U-4HA, produced by Shin Nakamura Kagaku Kogyo Co., Ltd.)

Monomer 4: 2-methacryloyloxy ethyl acid phosphate (LIGHT-ESTER P-2M, produced by Kyoeisha Chemical Co., Ltd.)

Monomer: Addition polymerizable monomer having an ethylenic double bond.

Sensitizing Dye 1

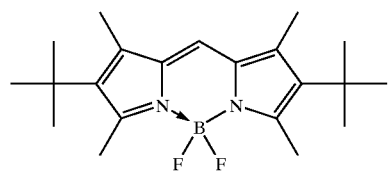

Sensitizing Dye 2

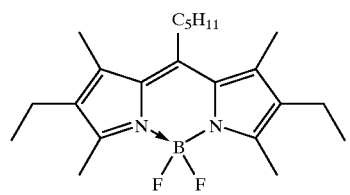

(Oxygen-shielding layer coating liquid, Overcoat layer)

| | |
|---|---|
| Polyvinyl alcohol (GL-03 produced by Nippon Gosei Kagaku Co., Ltd.) | 89 parts |
| Polyvinyl pyrrolidone (K-30 produced by Tokyo Kasei Co., Ltd.) | 10 parts |
| Surfactant (F142D produced by Dainippon Ink Kagaku Kogyo Co., Ltd.) | 0.5 parts |
| Water | 900 parts |

Preparation of Planographic Printing Plate Sample

The thus obtained photopolymerization type light sensitive planographic printing plate precursor with a size of 1003 mm×800 mm was imagewise exposed at a resolving degree of 2540 dpi (dpi represents the dot numbers per 2.54 cm) employing a CTP exposure apparatus (Tigercat produced by ECRM Co., Ltd.) installed with a FD-YAG laser source. The exposed printing plate precursor was processed employing a CTP automatic developing machine (PHW 23-V produced by Technicagraph Co., Ltd.), having a pre-washing section with a pre-washing tank charged with a pre-washing solution described later for removing the oxygen-shielding layer before development, a development section with a developer tank charged with a developer having the following composition, a post-washing section for removing the developer remaining on the developed plate after development, and a post-processing section with a gumming tank charged with a gumming solution (a solution obtained by diluting GW-3, produced by Mitsubishi Chemical Co., Ltd., with water by a factor of 2) for protecting the surface of the developed plate. Thus, planographic printing plate sample Nos. 1—1 through 1-10 were prepared, employing pre-washing solutions 1 through 10 described later, respectively.

(Developer Composition)

| | |
|---|---|
| Potassium silicate A (an aqueous potassium silicate solution containing 26.5% by weight of SiO$_2$ and 13.5% by weight of K$_2$O) | 80 g |
| Sodium butylnaphthalene sulfonate | 10 g |
| Polyoxyethylene (n = 13) naphthyl ether | 20 g |
| Polyoxyethylene (n = 13) naphthyl ether sulfuric ester sodium salt (*represented by formula below) | 10 g |
| Potassium hydroxide | Amount giving pH 12.1 |
| Diethylenetriaminepentaacetic acid pentasodium salt | 0.7 g |
| Water | 1 liter |

*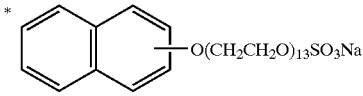

(Pre-Washing Solution in the Pre-Washing Tank)

The pre-washing solution used in the above processing is as follows.

Pre-washing solution 1: an aqueous solution containing 0.01% by weight of ethylenediaminedisuccinic acid disodium salt Pre-washing solution 2: an aqueous solution containing 0.01% by weight of methyliminodiacetic acid sodium salt Pre-washing solution 3: an aqueous solution containing 0.01% by weight of β-alaninediacetic acid sodium salt Pre-washing solution 4: an aqueous solution containing 0.01% by weight of ethylenediaminedisuccinic acid disodium salt and 0.01% by weight of sodium butylnaphthalene sulfonate Pre-washing solution 5: an aqueous solution containing 0.01% by weight of methyliminodiacetic acid sodium salt and 0.01% by weight of sodium butylnaphthalene sulfonate Pre-washing solution 6: an aqueous solution containing 0.01% by weight of β-alaninediacetic acid sodium salt and 0.01% by weight of sodium butylnaphthalene sulfonate Pre-washing solution 7: an aqueous solution containing 0.01% by weight of ethylenediaminetetraacetic acid disodium salt Pre-washing solution 8: an aqueous solution containing 0.01% by weight of sodium butylnaphthalene sulfonate Pre-washing solution 9: an aqueous-solution containing 0.01% by weight of polyoxyethylene lauryl ether
Pre-washing solution 10: water.
Evaluation The resulting planographic printing plate sample was evaluated for peppering and sludge according to the following procedures. Herein, "peppering" refers to (undesired) spots produced on the support after printing was started, stopped during a predetermined interval, and then resumed.
(Peppering)

The resulting planographic printing plate sample was mounted on a printing machine (DAIYA1F-1 produced by Mitsubishi Jukogyo Co., Ltd.), and printing was carried out wherein a coated paper, dampening water (Etch Solution SG-51 (concentration 1.5%) produced by Tokyo Ink Co., Ltd.) and printing ink (Hyplus M magenta produced by Toyo Ink Manufacturing Co., Ltd.) were used. After five thousand sheets of coated paper were printed, printing was stopped for 1 hour, and then printing was resumed to obtain one hundred prints. The number of peppering was counted per 100 cm$^2$ (10 cm×10 cm) of non-image portions of the one hundredth print after the resumption of a print run, employing a magnifier. Evaluation was carried out according to the following criteria.

A peppering number of not more than 20 are practically non-problematic, a peppering number exceeding 20 can be a little problematic for practical use, and a peppering number of not less than 30 is problematic for practical use.
(Sludge)

An exposed light sensitive planographic printing plate precursor was processed employing an automatic developing machine as shown in FIG. 1, wherein pre-washing tank 1 was charged with 1 liter of each of the pre-washing solutions 1 to 10, a developer tank 2 with 9 liters of the developer described above, and a post-washing tank 3 with 3 liters of tap water. In FIG. 1, symbol "A" represents a pre-washing section, symbol "B" a development section, symbol "C" post-washing section, and symbol "T" a light sensitive planographic printing plate precursor transporting path. Numerical numbers 11, 12, 13, 14, and 15 represent transporting rollers of the light sensitive planographic printing plate precursor, numerical number 16 represents a squeegee roller, numerical number 17 represents a brush for development, numerical numbers 18a and 18b represent spray nozzle, and numerical numbers 19a and 19b represent pumps. Symbols *1 and *1' are connected through a pipe, and a pre-washing solution in the pre-washing tank 1 is circulated through pump 19a from *1' to *1. Symbols *2 and *2' are connected a poet-washing solution in the post-washing through a pump 19b from *2' to *2.

In the above processing, 50 ml of each of the pre-washing solution, developer and post-washing solution were replenished per 1 m$^2$ of the exposed planographic printing plate precursor to have been processed, and the pre-washing time was 15 seconds, the developing time 30 seconds, and the post-washing time 20 seconds. Twenty square meters per day of the light sensitive planographic printing plate precursor obtained above was processed, and the processing was carried out for 30 days. Thus, 600 m$^2$ of the planographic printing plate precursor were processed. After the processing, the pre-washing solution was discharged from the developer tank, and sludge adhered to the developer tank walls was visually observed, and evaluated according to the following criteria:
A: No sludge was observed.
B: Only slight sludge was observed, but not practically problematic at all.
C: Slight sludge was observed, which was in practically permissible amount.
D: Sludge was produced, and the pump for supplying a developer did not work due to the sludge, or the sludge was adhered to the resulting printing plate, producing staining.

The results are shown in Table 1.

TABLE 1

| Planographic printing plate Sample No. | Pre-washing solution No. | Evaluation Peperring | Evaluation Sludge | Remarks |
| --- | --- | --- | --- | --- |
| 1-1 | 1 | 13 | B | Invention |
| 1-2 | 2 | 19 | B | Invention |
| 1-3 | 3 | 19 | B | Invention |
| 1-4 | 4 | 10 | B | Invention |
| 1-5 | 5 | 15 | B | Invention |
| 1-6 | 6 | 16 | B | Invention |
| 1-7 | 7 | 22 | C | Comparative |
| 1-8 | 8 | 27 | D | Comparative |
| 1-9 | 9 | 25 | D | Comparative |
| 1-10 | 10 | 35 | D | Comparative |

As is apparent from Table 1 above, the planographic printing plate obtained according to the method of the invention, employing the pre-washing solution in the invention, reduces peppering occurring on the surface of the printing plate, when printing is continuously carried out, suspended and then resumed, and further minimizes sludge produced in the developing tank during continuous processing, as compared with the comparative methods employing the pre-washing solution falling outside the scope of the invention.

Example 2

Light sensitive planographic printing plate precursor samples 2-1 through 2-8 were prepared in the same manner as in Example 1, except that the following oxygen-shielding layer coating liquids 1 through 8 were coated on the light sensitive layer instead of the oxygen-shielding layer coating liquid used in Example 1.
(Oxygen-Shielding Layer Coating Liquid 1)

| | |
| --- | --- |
| Polyvinyl alcohol | 89 parts |
| (GL-03 produced by Nippon Gosei Kagaku Co., Ltd.) | |
| Polyvinyl pyrrolidone | 10 parts |
| (K-30 produced by Tokyo Kasei Co., Ltd.) | |
| Surfactant | 0.5 parts |
| (F142D produced by Dainippon Ink Kagaku Kogyo Co., Ltd.) | |
| Water | 900 parts |

(Oxygen-Shielding Layer Coating Liquid 2)

One part of ethylenediaminedisuccinic acid disodium salt was further added to oxygen-shielding layer coating liquid 1 above.
(Oxygen-Shielding Layer Coating Liquid 3)

One part of methyliminodiacetic acid sodium salt was further added to oxygen-shielding layer coating liquid 1 above.
(Oxygen-Shielding Layer Coating Liquid 4)

One part of β-alaninediacetic acid sodium salt was further added to oxygen-shielding layer coating liquid 1 above.
(Oxygen-Shielding Layer Coating Liquid 5)

Five parts of sodium butylnaphthalene sulfonate were further added to oxygen-shielding layer coating liquid 2 above.
(Oxygen-Shielding Layer Coating Liquid 6)

Five parts of sodium butylnaphthalene sulfonate were further added to oxygen-shielding layer coating liquid 3 above.
(Oxygen-Shielding Layer Coating Liquid 7)

Five parts of sodium butylnaphthalene sulfonate were further added to oxygen-shielding layer coating liquid 4 above.

(Oxygen-Shielding Layer Coating Liquid 8)

One part of ethylenediaminetetraacetic acid disodium salt was further added to oxygen-shielding layer coating liquid 1 above.

The resulting light sensitive planographic printing plate precursor samples 2-1 through 2-8 were processed in the same manner as in Example 1, except that tap water was used instead of the pre-washing solutions used in Example 1. Thus, planographic printing plate samples 2-1 through 2-8 were obtained. Evaluation was carried out in the same manner as in Example 1.

The results are shown in Table 2.

TABLE 2

| Planographic printing plate Sample No. | Oxygen-shielding layer coating liquid No. | Evaluation Peperring | Sludge | Remarks |
|---|---|---|---|---|
| 2-1 | 1 | 30 | D | Comparative |
| 2-2 | 2 | 15 | B | Invention |
| 2-3 | 3 | 18 | B | Invention |
| 2-4 | 4 | 19 | B | Invention |
| 2-5 | 5 | 10 | B | Invention |
| 2-6 | 6 | 13 | B | Invention |
| 2-7 | 7 | 15 | B | Invention |
| 2-8 | 8 | 25 | C | Comparative |

As is apparent from Table 2 above, the planographic printing plate obtained according to the method of the invention reduces peppering occurring on the surface of the printing plate, when printing is continuously carried out, suspended and then resumed, and further minimizes sludge produced in the developing tank during continuous processing, resulting in reduction of load of cleaning.

Effect of the Invention

The present invention provides a light sensitive planographic printing plate precursor processing method which prevents peppering occurring at non-image portions of the processed printing plate, when printing is continuously carried out employing the printing plate, suspended, and then resumed, and further minimizes sludge produced in a developing tank during long-term continuous processing, and provides a pre-washing solution used in the method.

What is claimed is:

1. A method of processing a light sensitive planographic printing plate precursor comprising a support, and provided thereon, a light sensitive layer and an overcoat layer in that order, the method comprising the steps of:

imagewise exposing the light sensitive planographic printing plate precursor;

pre-washing the exposed light sensitive planographic printing plate precursor with a pre-washing solution in the presence of a compound represented by the following formula (1) or (2), or an N-alkyliminodiacetic acid or its salt, the alkyl being a methyl group, an ethyl group, a propyl group, an isopropyl group, a hydroxyl group-substituted methyl group, a hydroxyl group-substituted ethyl group, a hydroxyl group-substituted propyl group, or a hydroxyl group-substituted isopropyl group; and developing the pre-washed light sensitive planographic printing plate precursor with a developer,

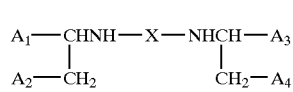

Formula (1)

wherein $A_1$, $A_2$, $A_3$, and $A_4$ independently represents —$CH_2OH$, —$PO_3(M_1)_2$, or —COOM, in which M and $M_1$ independently represent a hydrogen atom, an ammonium group, an alkali metal atom or an organic ammonium group, and may be the same or different; and X represents an alkylene group having a carbon atom number of 2 to 4 or —$(B_1O)_n$—$(B_2)$—, in which $B_1$ and $B_2$ independently represent an alkylene group having a carbon atom number of 1 to 5, and may be the same or different, and n is an integer of 1 to 8,

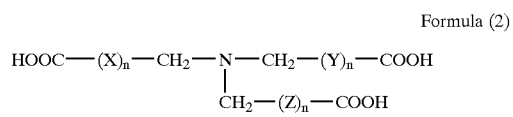

Formula (2)

wherein X1, Y and Z independently represents —$CH_2$—, —$(CH_2)_2$—, or —CHOH—, and n1 is 0 or 1.

2. The method of claim 1, wherein the pre-washing is carried cut employing a pre-washing solution which is an aqueous solution containing the compound represented by formula (1) or (2), or the N-alkyliminodiacetic acid or its salt.

3. The method of claim 2, wherein the pre-washing solution is an aqueous solution containing a compound represented by formula (1).

4. The method of claim 2, wherein the pre-washing solution is an aqueous solution containing an N-alkyliminodiacetic acid or its salt, the alkyl having a carbon atom number of 1 to 3.

5. The method of claim 2, wherein the pre-washing solution contains the compound represented by formula (1) or (2), or the N-alkyliminodiacetic acid or its salt in an amount of from 0.001 to 1.0% by weight.

6. The method of claim 2, wherein the pre-washing solution is re-circulated and supplied onto the surface of the printing plate precursor through a spray.

7. The method of claim 6, wherein the amount of the pre-washing solution to be supplied onto the surface of the printing plate precursor is from 0.5 to 20 liters per $m^2$ of the printing plate precursor.

8. The method of claim 2, wherein the temperature of the pre-washing solution is from 15 to 65° C.

9. The method of claim 1, further comprising the step of post-washing the developed light sensitive planographic printing plate precursor with post-washing water.

10. The method of claim 1, wherein the overcoat layer contains polyvinyl alcohol or polyvinyl pyrrolidone.

11. The method of claim 1, wherein the developer contains an alkali metal containing compound selected from the group consisting of potassium silicate, sodium silicate, lithium silicate, potassium metasilicate, sodium metasilicate, lithium metasilicate, potassium phosphate, sodium phosphate, lithium phosphate, potassium hydrogenphosphate, sodium hydrogenphosphate, lithium hydrogenphosphate, potassium carbonate, sodium carbonate, lithium carbonate, potassium hydrogen carbonate, sodium hydrogen carbonate, lithium hydrogen carbonate, potassium borate, sodium borate, or lithium borate.

12. The method of claim 11, wherein the alkali metal containing compound is potassium silicate or sodium silicate.

13. The method of claim 12, wherein the concentration of the silicate in the developer is from 1.0 to 3.0% by weight in terms of $SiO_2$ concentration.

14. The method of claim 11, wherein the developer further contains a weak acid having an acid dissociation constant of from 10.0 to 13.2.

15. The method of claim 1, wherein the pH of the developer is from more than 8.5 to less than 13.0.

16. The method of claim 1, wherein the overcoat layer contains a compound selected from the compound of formula (1) or (2), and the N-alkyliminodiacetic acid or its salt.

* * * * *